(12) United States Patent
Tashiro

(10) Patent No.: US 10,518,524 B2
(45) Date of Patent: Dec. 31, 2019

(54) FLEXO PRINTING PLATE

(71) Applicant: FUJIFILM Corporation, Tokyo (JP)

(72) Inventor: Hiroshi Tashiro, Shizuoka (JP)

(73) Assignee: FUJIFILM Corporation, Minato-ku, Tokyo (JP)

( * ) Notice: Subject to any disclaimer, the term of this patent is extended or adjusted under 35 U.S.C. 154(b) by 0 days.

(21) Appl. No.: 15/655,224

(22) Filed: Jul. 20, 2017

(65) Prior Publication Data

US 2017/0313117 A1 Nov. 2, 2017

Related U.S. Application Data

(63) Continuation of application No. PCT/JP2016/052186, filed on Jan. 26, 2016.

(30) Foreign Application Priority Data

Feb. 19, 2015 (JP) .................... 2015-030399

(51) Int. Cl.
| | |
|---|---|
| *B41N 1/12* | (2006.01) |
| *B41N 1/22* | (2006.01) |
| *B41D 7/04* | (2006.01) |
| *B41C 1/05* | (2006.01) |
| *G03F 7/004* | (2006.01) |
| *B41F 5/24* | (2006.01) |

(52) U.S. Cl.
CPC .................. *B41D 7/04* (2013.01); *B41C 1/05* (2013.01); *B41F 5/24* (2013.01); *B41N 1/12* (2013.01); *G03F 7/004* (2013.01); *B41N 1/22* (2013.01)

(58) Field of Classification Search
None
See application file for complete search history.

(56) References Cited

U.S. PATENT DOCUMENTS

| | | |
|---|---|---|
| 2011/0252990 A1 | 10/2011 | Shimazaki et al. |
| 2012/0055360 A1* | 3/2012 | Mushano ................. B41C 1/05 101/395 |

FOREIGN PATENT DOCUMENTS

| | | | |
|---|---|---|---|
| JP | 2007185917 A | * | 7/2007 |
| JP | 2011-224878 A | | 11/2011 |

OTHER PUBLICATIONS

Extended European Search Report dated Feb. 23, 2018 issued by the European Patent Office in counterpart European Application No. 16752217.6.

(Continued)

*Primary Examiner* — Joshua D Zimmerman
(74) *Attorney, Agent, or Firm* — Sughrue Mion, PLLC

(57) ABSTRACT

Provided is a flexo printing plate which makes it possible to perform printing in which the discontinuity of density is not visually recognized by inhibiting the enlargement of halftone dots in the boundary between an image portion having a low halftone dot area ratio and a non-image portion. The flexo printing plate adopts a constitution in which, within the highlight halftone dot portion having a halftone dot area ratio of higher than 0% and equal to or lower than 10%, among the small dots constituting the highlight halftone dot portion, at least one small dot adjacent to the non-image portion that continues 10 mm or further in a direction separating from the edge of the highlight halftone dot portion has a height smaller than the average height of the small dots of the highlight halftone dot portion.

9 Claims, 5 Drawing Sheets

(56) References Cited

OTHER PUBLICATIONS

International Search Report for PCT/JP2016/052186 dated Apr. 26, 2016 [PCT/ISA/210].
International Preliminary Report on Patentability dated Aug. 31, 2017 in counterpart application No. PCT/JP2016/052186.

* cited by examiner

FLEXO PRINTING PLATE

CROSS-REFERENCE TO RELATED APPLICATIONS

This application is a Continuation of PCT International Application No. PCT/JP2016/052186 filed on Jan. 26, 2016, which claims priority under 35 U.S.C. § 119(a) to Japanese Patent Application No. 2015-030399 filed on Feb. 19, 2015. The above application is hereby expressly incorporated by reference, in its entirety, into the present application.

BACKGROUND OF THE INVENTION

1. Field of the Invention

The present invention relates to a flexo printing plate.

2. Description of the Related Art

A flexo printing plate having a flexible relief forming layer made of a resin or rubber has relatively soft projections (image portions) for printing and can conform to various shapes. Therefore, a flexo printing plate is used for printing performed on printing targets made of various materials, thick printing targets, and the like.

The flexo printing plate has a constitution in which a halftone dot portion consisting of many projection-like small dots is formed, and the size or density of the small dots in the halftone dot portion is varied. En this way, the flexo printing plate expresses the density of an image printed on a printing target (JP2011-224878A).

During the flexo printing performed using such a flexo printing plate, the flexo printing plate is loaded onto the peripheral surface of a cylindrical drum, and while a roller is being rotated, the flexo printing plate is brought into contact with a printing target. In this way, ink is directly transferred to the printing target from the surface of projections (image portions) of the printing plate, and an image is formed on the printing target.

SUMMARY OF THE INVENTION

In flexo printing, a highlight portion with low density and a non-image portion are printed in a state of being adjacent to each other, and in this way, a continuous change of color density, that is, gradation is expressed.

According to the examination conducted by the inventor of the present invention, it was found that, when printing is performed using a flexible flew printing plate, in the boundary between an image portion with a low halftone dot area ratio and a non-image portion, a phenomenon of halftone dot enlargement occurs in some cases. It was found that, due to the phenomenon of halftone dot enlargement, the image portion with a low halftone dot area ratio, that is, the highlight portion is connected to a non-image portion, in other words, gradation starts, the boundary line between the highlight portion and the non-image portion becomes thick, and hence the problem of discontinuity of density which is so-called tone jump occurs in some cases.

The present invention is for solving the aforementioned problem of the related art, and an object thereof is to provide a flexo printing plate which makes it possible to perform printing in which the discontinuity of density is not visually recognized by inhibiting the enlargement of halftone dots in the boundary between an image portion with, a low halftone dot area ratio and a non-image portion.

In order to achieve the above object, the inventors of the present invention conducted intensive research. As a result, the inventors found that, by adopting a constitution in which within a highlight halftone dot portion having a halftone dot area ratio higher than 0% and equal to or lower than 10%, among small dots constituting the highlight halftone dot portion, at least one small dot adjacent to a non-image portion that continues 10 nm or farther in a direction separating from the edge of the highlight halftone dot portion has a height smaller than the height of a small dot closest to the center of the highlight halftone dot portion, it is possible to perform printing in which the discontinuity of density is not visually recognized by inhibiting the enlargement of a halftone dot in the boundary between an image portion having a low halftone dot area ratio and a non-image portion. Based on what they found, the inventors accomplished the present invention.

That is, the present invention provides a flexo printing plate constituted as below.

(1) A flexo printing plate comprising an image portion including a halftone dot portion and a non-image portion, in which within a highlight halftone dot portion having a halftone dot area ratio of higher than 0% and equal to or lower than 10%, among small dots constituting the highlight halftone dot portion, at least one small dot adjacent to the non-image portion that continues 10 mm or farther in a direction separating from the edge of the highlight halftone dot portion has a height smaller than an average height of the small dots of the highlight halftone dot portion.

(2) The flexo printing plate described in (1), in which within the highlight halftone dot portion, the height of the small dots decreases as the small dots become close to the non-image portion.

(3) The flexo printing plate described in (1) or (2), in which a difference between a height of a small dot adjacent to the non-image portion and the average height of the small dots in the highlight halftone dot portion is 5% to 70% of the average height of the small dots of the highlight halftone dot portion.

(4) The flexo printing plate described in any one of (1) to (3), in which the height of all small dots adjacent to the non-image portion is smaller than the height of a small dot closest to the center of the highlight halftone dot portion.

(5) The flexo printing plate described in any one of (1) to (4), in which a distal end diameter of the small dot adjacent to the non-image portion is smaller than a distal end diameter of the small dot closest to the center of the highlight halftone dot portion.

(6) The flexo printing plate described in any one of (1) to (5), in which the image portion including the highlight halftone dot portion and the non-image portion are formed by laser engraving.

According to the present invention, it is possible to provide a flexo printing plate which makes it possible to perform printing in which the discontinuity of density is not visually recognized by inhibiting the enlargement of halftone dots in the boundary between an image portion having a low halftone dot area ratio and a non-image portion.

DESCRIPTION OF THE PREFERRED EMBODIMENTS

Hereinafter, the flexo printing plate of the present invention will be specifically described based on suitable embodiments shown in the attached drawings.

In the following section, constituents will be described based on typical embodiments of the present invention in some cases, but the present invention is not limited to the embodiments.

In the present specification, a range of numerical values described using "to" means a range including the numerical values listed before and after "to" as a lower limit and an upper limit.

[Flexo Printing Plate]

The flexo printing plate (hereinafter, simply referred to as "printing plate" as well) according to the present invention is a flexo printing plate in which within a highlight halftone dot portion having a halftone dot area ratio higher than 0% and equal to or lower than 10%, among small dots constituting the highlight halftone dot portion, at least one small dot adjacent to a non-image portion that continues 10 mm or further in a direction separating the edge of the highlight halftone dot portion has a height smaller than an average height of small dots of the highlight halftone dot portion.

Hereinafter, the constitution of the flexo printing plate according to the present invention will be specifically described based on the attached drawings.

Figure 1:
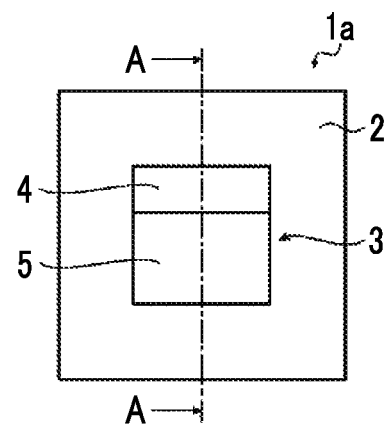
FIG. 1 is a schematic top view showing an example of a flexo printing plate according to the present invention.
Figure 2A:
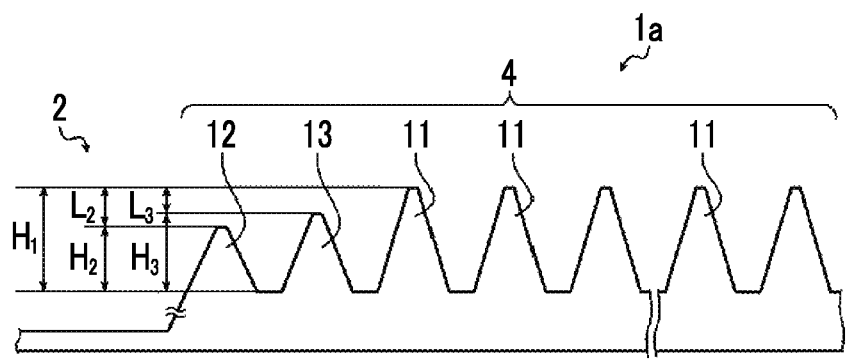
FIG. 2A is a cross-sectional view taken along the line A-A of the flexo printing plate shown in FIG. 1.
Figure 2B:
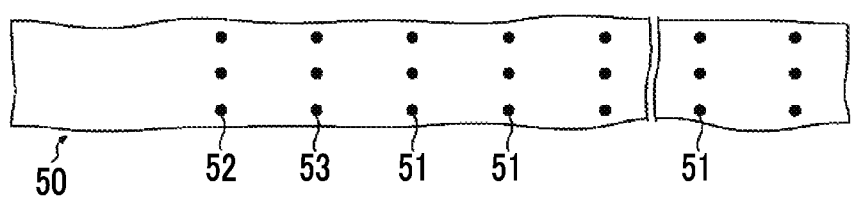
FIG. 2B is a view schematically showing an image printed using the flexo printing plate of FIG. 2A.

FIG. 1 is a top view schematically showing an example of the flexo printing plate according to the present invention, and FIG. 2A is an enlarged view showing a portion of a cross-sectional view taken along the line A-A of FIG. 1. FIG. 2B is a view schematically showing an image printed using the flexo printing plate shown in FIG. 2A. In FIG. 2B, each of the dots formed on a printing substrate 50 (a first dot 51, a second dot 52, and a third dot 53) is formed through the transfer of ink by small dots (a first small dot 11, a second small dot 12, and a third small dot 13) in the in positions corresponding to the horizontal direction in FIG. 2A.

As shown in FIG. 1, a printing plate 1a as an example of the flexo printing plate according to the present invention has an image portion 3 and a non-image portion 2.

The image portion. 3 is a region to which ink is applied and from which the ink is transferred to a printing substrate at the time of printing, that is, a region which forms an image at the time of printing. The non-image portion 2 is a region to which ink is not applied at the time of printing, that is, a region which does not form an image.

The image portion 3 includes a solid portion for performing printing as if painting a printing substrate by transferring ink to the whole surface of the substrate and/or a halftone dot portion which is constituted with a plurality of projection-like small dots and expresses the density (gradation) of an image printed on a printing target by varying the size or density of the small dots.

Generally, the small dots constituting the halftone dot portion are formed based on a predetermined number of screen lines (definition), for example, based on the number of screen lines of about 100 to 175 lines per inch (lpi).

The image portion 3 of the printing plate 1a as the flexo printing plate of the present invention has a highlight halftone dot portion 4 having a halftone dot area ratio higher than 0% and equal to or lower than 10%. In the example shown in the drawing, the image portion 3 above the broken line is the highlight halftone dot portion 4, and the image portion 3 below the broken line is an image portion 5 which has a halftone dot area ratio higher than 10% and equal to or lower than 100% and is not included in the highlight halftone dot portion.

hi the present invention, the highlight halftone dot portion 4 has a constitution in which at least one of the small dots which are in a direction orthogonal to the edge of the highlight halftone dot portion 4 and adjacent to the non-image portion 2 that continues 10 mm or further in a direction separating from the edge has a height smaller than the average height of the small dots of the highlight halftone dot portion 4.

FIG. 2A is an enlarged cross-sectional view of the boundary portion between the non-image portion 2 and the highlight halftone dot portion 4.

As shown in FIG. 2A, the highlight halftone dot portion 4 has many small dots constituting halftone dots, in which the height of the small dot 12 (hereinafter, referred to as the second small dot 12) adjacent to the non-image portion 2 and the height of the small dot adjacent to the second small dot 12, that is, the height of the small dot 13 (hereinafter, referred to as the third small dot 13) positioned in the second line from the non-image portion 2 side are smaller than the height of the first small dot 11 which is a small dot other than the second small dot 12 and the third small dot 13. The first small dots 11 which are small dots other than the second small dot 12 and the third small dot 13 have the same height. Furthermore, it is the first small dot 11 that is closest to the center of the highlight halftone dot portion 4. Accordingly, the height of the second small dot 12 and the third small dot 13 is smaller than the height of the small dot closest to the center.

Therefore, the height of the second small dot 12 and the third small dot 13 is smaller than the average height of all of the small dots constituting the highlight halftone dot portion 4.

As described above, it was found that, when printing is performed using a flexible flexo printing plate, the phenomenon of halftone dot enlargement occurs in the boundary between a highlight image portion having a low halftone dot area ratio and a non-image portion, and hence tone jump occurs in some cases.

Figure 8A:
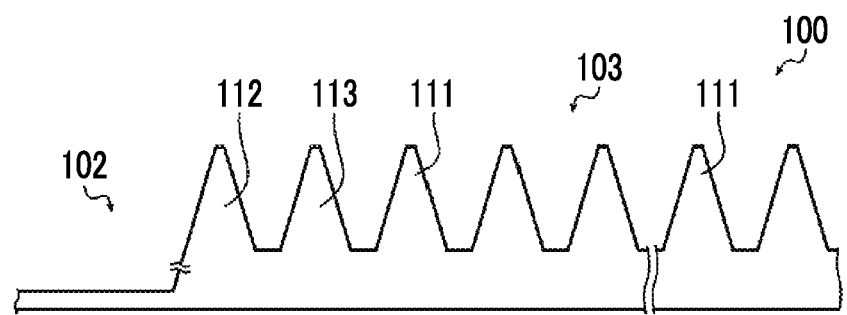
FIG. 8A is a schematic cross-sectional view showing a flexo printing plate of the related art.
Figure 8B:
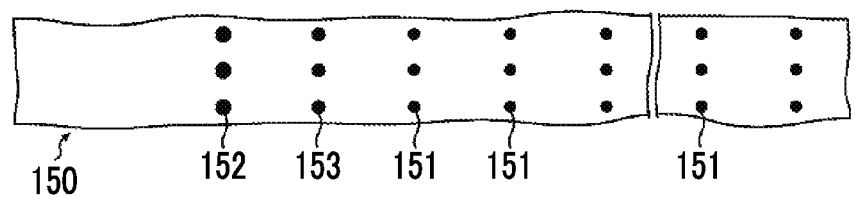
FIG. 8B is a view schematically showing an image printed using the flexo printing plate of FIG. 8A.

FIG. 8A is a schematic cross-sectional view showing an example of a flexo printing plate of the related art. FIG. 8B is a schematic view of an image printed using the flexo printing plate of FIG. 8A. In FIG. 8B, each of the dots (a first dot 151, a second dot 152, and a third dot 153) formed on a printing substrate 150 is formed through the transfer of ink by small dots (a first small dot 111, a second small dot 112, and a third small dot 113) in the positions corresponding to the horizontal direction in FIG. 8A.

Just as a flexo printing plate 100 shown in FIG. 8A, the flexo printing plate of the related art has a constitution in which within a highlight halftone dot portion having a halftone dot area ratio higher than 0% and equal to or lower than 10%, all of the small dots constituting the highlight halftone dot portion have the same height, That is, the second small dot 112 adjacent to a non-image portion 102, the third small dot 113 position in the second line from the non-image portion 102 side, and the first small dot 111 other than the second small dot 112 and the third small dot 113 have the same height.

The flexo printing plate 100 is formed of a flexible material made of a resin or rubber. Therefore, in a case where printing is performed using such a printing plate 100, printing pressure is concentrated on the second small dot 112 in the vicinity of the non-image portion 102 or the third small dot 113, the small dots collapse, and hence a phenomenon of collapse and enlargement of the small dots occurs.

As a result, as shown in FIG. 8B, the size of the second clot 152 and the third dot 153 formed through the transfer of ink, which has adhered to the second small dot 112 adjacent to the non-image portion 102 or the third small dot 113 in the vicinity of the non-image portion 102, to the printing substrate 150 becomes greater than the size of the first dot 151 formed through the transfer of ink from the first small dot 111 in the position separating from the non-image portion 102. Due to the phenomenon of enlargement of the small dots adjacent to the non-image portion, the highlight portion is connected to the non-image portion, that is, gradation starts, the boundary line between the highlight portion and the non-image portion becomes thick, and this leads to the problem of the occurrence of discontinuity of density which is so-called tone jump.

In contrast, in a printing plate la which is the flexo printing plate of the present invention, among the small dots constituting the highlight halftone dot portion 4, the second small dot 12 adjacent to the non-image portion 2 and the third small dot 13 positioned in the second line from the non-image portion 2 side have a height smaller than the average height of the small dots of the highlight halftone dot portion 4.

Accordingly, in a case where printing is performed using the printing plate 1 a, it is possible to inhibit the printing pressure from being concentrated on, the second small dot 12 in the vicinity of the non-image portion 2 or the third small dot 13 and to inhibit the phenomenon of collapse and enlargement of the small dots.

Therefore, as shown in FIG. 2B, the size of the second dot 52 and the third dot 53 formed through the transfer of ink, which has adhered to the second small dot 12 adjacent to the non-image portion 2 or the third small dot 13 in the vicinity of the non-image portion 2, to the printing substrate 50 becomes the same as the size of the first dot 51 formed through the transfer of ink, from the first small dot 11 in the position separating from the non-image portion 2. As a result, it is possible to inhibit the occurrence of tone jump resulting from the connection between the highlight portion and the non-image portion, that is, the start of gradation.

Herein, the height of a small dot refers o a height measured from the bottom portion between small dots.

It is preferable that a difference $L_2$ between an average height $H_1$ of the small dots in the highlight halftone dot portion 4 and a height $H_2$ of the second small dot 12 is 5% to 70% of the average height $H_1$ of the small dots in the highlight halftone dot portion 4.

It is preferable that the difference $L_2$ of height is equal to or greater than 5% of $H_1$, because then the printing pressure can be inhibited from being concentrated on the second small dot 12 at the time of printing.

Furthermore, it is preferable that the difference $F_2$ of height is equal to or greater than 70% of $H_1$, because then the second small dot 12 can be reliably pressed on the printing substrate 50, and the occurrence of voids can be prevented.

From the viewpoint described above, the difference $L_2$ of height is more preferably 6% to 65% and particularly preferably 10% to 60% of the average height $H_1$ of the small dots in highlight halftone dot portion 4.

Hereinbelow, the difference between the average height of the small dots and the height of a small dot wilt be described as "lowering amount" as well, and forming a small dot having a height smaller than the average height of the small dots will be described as "lowering" as well.

Generally, in a flexo printing plate, small dots other than small dots in the vicinity of the non-image portion 2 have the same height. Accordingly, the average height $H_1$ of the small dots in the highlight halftone dot portion 4 is substantially the same as the height of the first small dot 11 which is a small dot other than the small dot in the vicinity of the non-image portion 2.

Therefore, the second small dot 12 and the third small dot 13 can be said to have a height greater than the height of the small dot closest to the center of the highlight halftone dot portion 4.

The height of the first small dot in the flexo printing plate is about 100 to 150 μm. Consequently, the average height $H_1$ of the small dots of the highlight halftone dot portion 4 is about 100 to 150 μm which is substantially the same as the height of the first small dot 11 that is a small dot other than the small dots in the vicinity of the non-image portion 2.

In the example shown in FIG. 2A, the height of the bottom portion of a region between small dots is different from the height of the surface of the non-image portion 2. However, the present invention is not limited thereto, and the height of the bottom portion of the region between small dots may be the same as the height of the surface of the non-image portion 2.

In the example shown in FIG. 2A, a constitution is adopted in which the second small dot 12 adjacent to the non-image portion 2 and the third small dot 13 positioned in the second line from the non-image portion 2 side are lowered, but the present invention is not limited thereto.

For example, the small dots that are positioned in the third line and the following lines from the non-image portion 2 may be lowered. At this time, the small dots in the first to tenth lines are preferably lowered, and the small dots in the first and second lines are particularly preferably lowered. It is also preferable to lower the small dots within a range of 500 μm from the boundary between the highlight halftone dot portion 4 and the non-image portion 2.

Alternatively, a constitution may be adopted in which only the second small dot 12 adjacent to the non-image portion 2 is lowered.

In a case where the small dots positioned in the second line and the following lines from the non-image portion 2 are lowered, the lowering amount is preferably 5% to 70% of the average height $H_1$ of the small dots of the highlight halftone dot portion 4.

In the example shown in FIG. 2A, a difference La between the average height $H_1$ of the small dots of the highlight halftone dot portion 4 and a height $H_3$ of the third small dot 13 is preferably 5% to 70% of the average height $H_1$ of the small dots of the highlight halftone dot portion 4.

In a case where the small dots positioned in the second line and the following lines from the non-image portion 2 are lowered, it is preferable that the height of the small dots decreases as the small dots become close to the non-image portion 2 such that the second small dot adjacent to the non-image portion 2 becomes the lowest among the small dots of the highlight halftone dot portion 4.

In the example shown in FIG. 2A, as a preferred aspect, the second small dot 12 adjacent to the non-image portion 2 is lower than the third small dot 13 in the second line from the non-image portion 2.

It is preferable to adopt the aforementioned aspect, because then the concentration of printing pressure on the second small dot 12 adjacent to the non-image portion 2 can be more suitably inhibited, and the occurrence of voids at the time of printing can be prevented due to the lowered small dots such as the third small dot 13.

Its a case where the small dots positioned in the second line and the following lines from the non-image portion 2 are lowered, die lowering amount of the small dots in the second line and the following lines may be the same as the lowering amount of the second small dot 12 adjacent to the non-image portion 2.

Figure 3:
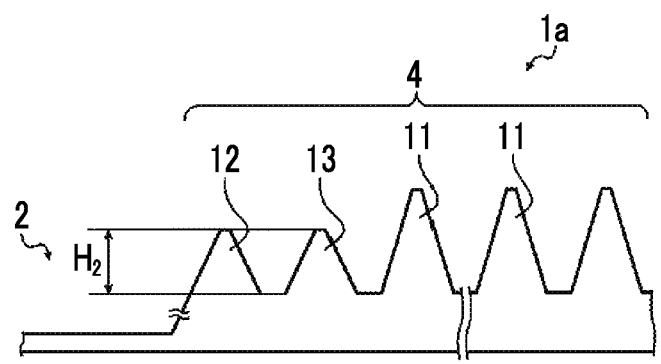
FIG. 3 is a schematic cross-sectional view showing another example of the flexo printing plate of the present invention.

For example, as in flexo printing plate 1a shown in FIG. 3, the height of the second small dot 12 adjacent to the non-image portion 2 may be the same as the height of the third small dot 13 of the second line.

In the present invention, within the highlight halftone dot portion 4, at least one of the small dots adjacent to the non-image portion 2 that continues 10 mm or further in a direction separating from the edge of the highlight halftone dot portion 4 may have a height smaller than the average height of the small dots of the highlight halftone dot portion 4. However, it is preferable that all of the small dots adjacent to the non-image portion 2 that continues 10 mm or further in the direction separating from the edge of the highlight halftone dot portion 4 have a height smaller than the average height of the small dots of the highlight halftone dot portion 4.

In a case where the aforementioned constitution is adopted, it is possible to more suitably inhibit the printing pressure from being concentrated on the second small dot 12 adjacent to the non-image portion 2.

In the example shown in FIG. 2A, the diameters of the distal end of the respective small dots are the same as each other. However, the present invention is not limited thereto, and the distal end diameter of the small dot adjacent to the non-image portion may he made smaller than the average of the distal end diameters of the small dots of the highlight halftone dot portion. Furthermore, the distal end diameter of lowered small dots other than the small dot adjacent to the non-image portion may be made smaller than the average of the distal end diameters of the small dots of the highlight halftone dot portion.

Figure 4:
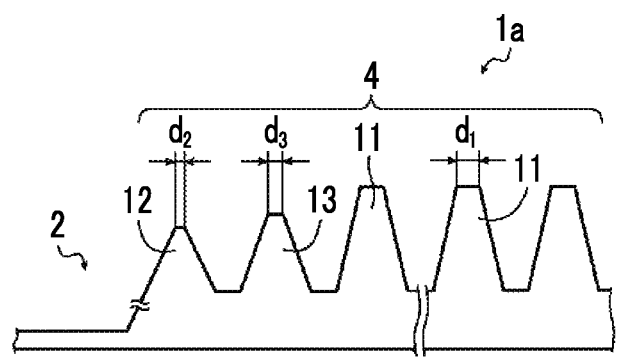
FIG. 4 is a schematic cross-sectional view showing another example of the flexo printing plate of the present invention.

FIG. 4 is a schematic cross-sectional view showing another example of the flexo printing plate of the present invention.

In the printing plate la shown in FIG. 4, the height of the second small dot 12 adjacent to the non-image portion 2 and the third small dot 13 positioned in the second line from the non-image portion 2 side is smaller than the height of the first small dot 11 which includes the small dot closest to the center and is other than the second small dot 12 and the third small dot 13. A distal end diameter $d_2$ of the second small dot 12 and a distal end diameter $d_3$ of the third small dot 13 are smaller than a distal end diameter $d_1$ of the first small dot. That is, the distal end diameter of the lowered second small clot 12 and third small dot 13 is smaller than the average of the distal end diameters of the small dots of the highlight halftone dot portion 4.

In this way, by making the distal end diameter of the lowered small dot smaller than the average of the distal end diameters of the small dots of the highlight halftone dot portion, even when the printing pressure is concentrated on the small dots on the non-image portion 2 side and hence the phenomenon of collapse and enlargement of the small dots occurs, the size of dots printed and formed on a printing substrate can he made the same as the size of dots formed by other small dots.

The distal end diameter $d_2$ of the second small dot 12 and the distal end diameter $d_3$ of the third small clot 13 may be appropriately set based on the distal end diameter $d_1$ of the first small dot 11, the printing conditions such as printing pressure, and the like. The distal end diameter $d_2$ and the distal end diameter $d_3$ are preferably 25% to 60% of the distal end diameter $d_1$ of the first small dot 11.

Herein, the distal end diameter of a small dot is a diameter measured in a position 5 μm distant from the top of the small dot.

In a case where the shape of a small dot in a cross-section perpendicular to the height direction is not circular, the diameter of a circle having an area equivalent to the area of the cross-section (equivalent circle diameter) is taken as the distal end diameter.

In the example shown in FIG. 2A, the cross-sectional shape of a small dot in a cross-section parallel to the height direction of the small dot is truncated. However, the present invention is not limited thereto, and the cross-sectional shape of the small dot may be rectangular, wavy, or the like.

In the cross-section perpendicular to the height direction of the small dot, the cross-sectional shape of the small dot may be circular, elliptical, rectangular, triangular, polygonal, or the like.

In the present invention, the small dot adjacent to the non-image portion that continues 10 mm or further in a direction separating from the edge of the highlight halftone dot portion is lowered. That is, in a case where the length of the non-image portion adjacent to the small dot is less than 10 mm, the small dot adjacent to this non-image portion is not lowered.

This point will be described using FIGS. 5A and 5B.

In the following description, the length of the non-image portion in the direction separating from the edge of the highlight halftone dot portion will be simply referred to as "length of non-image portion" as well.

Figure 5A:
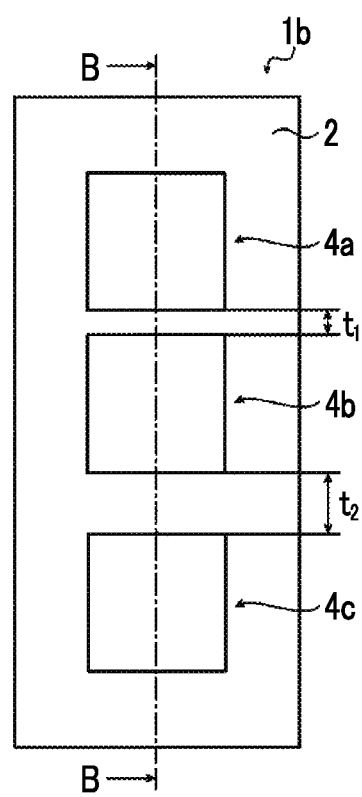
FIG. 5A is a schematic top view showing another example of the flexo printing plate of the present invention.
Figure 5B:
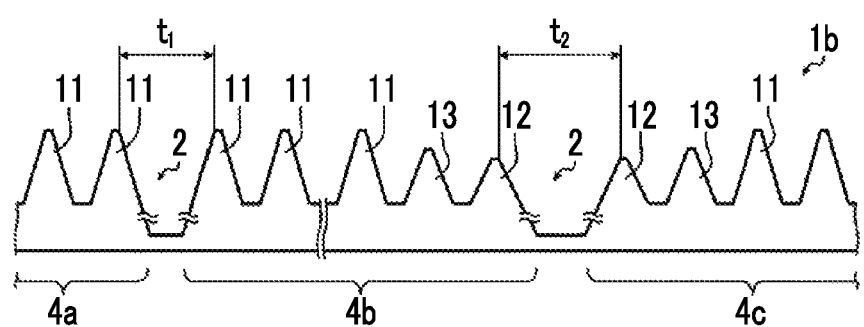
FIG. 5B is a cross-sectional view taken along the line B-B of FIG. 5A.

FIG. 5A is a top view schematically showing another example of the flexo printing plate of the present invention. FIG. 5B is a cross-sectional view taken along the line B-B of FIG. 5A.

A printing plate 1b shown in FIG. 5A has three image portions and the non-image portion 2. All of the image portions are highlight halftone clot portions 4 a to 4 c having a halftone dot area ratio higher than 0% and equal to or lower than 10%, As shown in the drawing, the highlight halftone dot portions 4a to 4c separate from each other by a predetermined distance and are arrayed in the vertical direction in the drawing.

A distance $t_1$ between the highlight halftone dot portion 4a disposed on the upper side in the drawing and the highlight halftone dot portion 4b disposed in the middle of the drawing is less than 10 mm. In contrast, a distance $t_2$ between the highlight halftone dot portion 4b disposed in the middle of the drawing and the highlight halftone dot portion 4c disposed on the lower side is equal to or greater than 10 mm.

Accordingly, the small dots constituting the edge of the lower side of the highlight halftone dot portion 4b in the drawing and the small dots constituting the edge of the upper side of the highlight halftone dot portion 4c in the drawing are small dots adjacent to the non-image portion that continues 10 mm or further in the direction separating from the edge of the highlight halftone dot portion. Therefore, as shown in FIG. 5B, the second small dot 12 adjacent to the non-image portion 2 and the third small dot 13 in the second line are lowered.

In contrast, although the small dots constituting the edge of the lower side of the highlight halftone dot portion 4a in the drawing and the small dot constituting the edge of the upper side of the highlight halftone dot portion 4b in the drawing are adjacent to the non-image portion 2, they are not small dots adjacent to the non-image portion that continues 10 mm or further in the direction separating from the edge of the highlight halftone dot portion. Therefore, as shown in FIG. 5B, the small dot adjacent to the non-image portion 2 is not lowered and has the same height as the small dot of the central side.

In a case where the small dot adjacent to the non-image portion having a length less than 10 mm is lowered, in other words, in a case where a gap between image portions is less than 10 mm, if the small dot adjacent to the non-image portion is lowered, sufficient printing pressure may not be applied to the lowered small dot, and voids may occur at the time of printing.

Accordingly, in the present invention, the small dot adjacent to the non-image portion having a length equal to or greater than 10 mm is lowered, and the small dot adjacent to the non-image portion having a length less than 10 mm is not lowered. In this way, it is possible to inhibit the printing pressure from being concentrated on the small dot adjacent to the non-image portion having a length equal to or greater than 10 mm, and to inhibit voids from occurring in a portion where the gap between image portions is short at the time of printing.

[Method for Manufacturing Flexo Printing Plate]

Next, a method for manufacturing the aforementioned flexo printing plate will be specifically described.

The method for manufacturing the flexo printing plate is a method in which a cured layer (relief forming layer) of a flexo printing plate precursor is laser-engraved such that the cured layer in the portion that will become a non-image portion is removed and that a projection-like image portion is formed, and the cured layer in the image portion is removed according to a desired number of screen lines, a predetermined halftone dot area ratio, and the like such that many small dots are formed and that a halftone dot portion is formed.

In the present invention, at the time of laser-engraving small dots (halftone dot portion), the small dot adjacent to the non-image portion having a length equal to or greater than 10 mm may be lowered.

Specifically, as an example of the method for manufacturing the flexo printing plate, first, the original image data of the printing plate to be prepared is obtained. Then, in order to convert the original image data into data for performing laser engraving, processing using a raster image processor (RIP) is performed.

Meanwhile, from the original image data, in each image portion, small dots in the vicinity of the non-image portion that include the small dot adjacent to the non-image portion having a length equal to or greater than 10 mm within the highlight halftone dot portion are extracted.

On each of the extracted small dots, a template of a pattern for applying a predetermined lowering amount is superimposed, thereby generating a mask. At this time, the template is selected such that the lowering amount of the small dots increases as the small dots become close to the non-image portion side.

Furthermore, the image data having undergone the RIP processing is multiplied by the generated mask, thereby generating output image data.

In this way, in the image portion of the original image data, by adding the pattern for applying the lowering amount to the small dot adjacent to the non-image portion of the highlight halftone dot portion, the output image data is generated. By using the output image data, laser engraving is performed, and a flexo printing plate is prepared.

Herein, the laser engraving method is basically the same as the laser engraving method used in the method for manufacturing a flexo printing plate of the related art.

As the laser engraving method, for example, it is possible to use a method in which a sheet-like printing plate precursor for laser engraving is wound around the outer peripheral surface of a cylindrical drum; the drum is rotated; a laser beam corresponding to the aforementioned output image data is emitted to the printing plate precursor from an exposure head; and the exposure head is caused to perform scanning at a predetermined pitch in a sub-scanning direction orthogonal to a main scanning direction such that a two-dimensional image is engraved (recorded) at a high speed on the surface of the printing plate precursor.

The type of the laser used in the laser engraving is not particularly limited, but an infrared laser is preferably used. By the irradiation of the infrared laser, molecules in the cured layer vibrate, and hence heat is generated. If a high-power laser such as a carbon dioxide laser or a yttrium aluminum garnet (YAG) laser is used as the infrared laser, a large amount of heat is generated in the portion irradiated with the laser, and the molecules in the cured layer are cleaved or ionized. As a result, the cured layer is selectively removed, that is, engraved. The advantage of the laser engraving is that it enables three-dimensional control of the structures because the engraving depth can be arbitrarily set. For example, in a portion on which minute halftone dots are printed, by shallowly engraving the cured layer or by engraving the cured layer with forming shoulders, it is possible to prevent the relief from being inverted due to the printing pressure. Furthermore, in a groove portion on which fine outline letters are printed, by deeply engraving the cured layer, it is possible to prevent the ink from easily filling the grooves and to inhibit the outline letters from collapsing.

Particularly, in a case where engraving is performed using an infrared laser corresponding to the absorption wavelength of a photothermal conversion agent, the cured layer can be selectively removed with higher sensitivity, and hence a relief layer having a sharp image is obtained.

As the infrared laser, in view of productivity; costs, and the like, a carbon dioxide laser ($CO_2$ laser) or a semiconductor laser is preferable., and a semiconductor infrared laser with fiber (FC-LD) is particularly preferable. Generally, compared to the $CO_2$ laser, the semiconductor laser has higher laser oscillation efficiency, is less expensive, and can be further miniaturized. Furthermore, it is easy to make an array of the semiconductor lasers because of the small size thereof. In addition, by treating the fiber, the beam shape can be controlled.

The wavelength of the semiconductor laser is preferably 700 to 1,300 nm, more preferably 800 to 1,200 nm, even more preferably 860 to 1,200 nm, and particularly preferably 900 to 1,100 nm.

In a case where the optical fiber is additionally mounted on the semiconductor laser with fiber, the laser can efficiently emit laser beams, and accordingly, such a laser is effective for the laser engraving. Furthermore, by treating the fiber, the beam shape can be controlled. For example, it is possible to make the beam profile have a top-hat shape, and in this way, energy can be stably applied to the surface of the plate. Details of the semiconductor laser are described in "Laser Handbook, $2^{nd}$ Edition" edited by Laser Society of Japan, and in "Practical Laser Technology" written and edited by institute of Electronics and Communication Engineers of Japan.

In addition, a plate-making apparatus including the semiconductor laser with fiber specifically described in JP2009-172658A and JP2009-214334A can be suitably used in the method for manufacturing the flexo printing plate of the present invention.

In the present invention, the method for manufacturing the flexo printing plate is not limited to laser engraving (direct laser engraving (DLE) method), and it is possible to use various known manufacturing methods such as a laser ablative mask system (LAMS) method in which an image is graven on the surface of a printing plate precursor by using a laser and developed.

[Flexo Printing Plate Precursor]

The flexo printing plate precursor used in the present invention is not particularly limited as long as it is a known resin plate or rubber plate for flexo printing. Furthermore, the printing plate precursor may have a sheet shape or a cylindrical shape.

It is preferable that the printing plate precursor has the following resin sheet as a cured layer (relief forming layer).

<Resin Sheet>

The resin sheet is preferably a sheet which is obtained in a manner in which a curable resin composition containing at least a polymer having a monomer unit derived from diene-based hydrocarbon (hereinafter, referred to as "resin composition for forming a resin sheet" as well) is made into a sheet-shaped material and cured by the action of heat and/or light, and more preferably a sheet formed of the resin composition for forming a resin sheet which will be described later.

It is preferable that the resin sheet can he laser-engraved.

Figure 6:
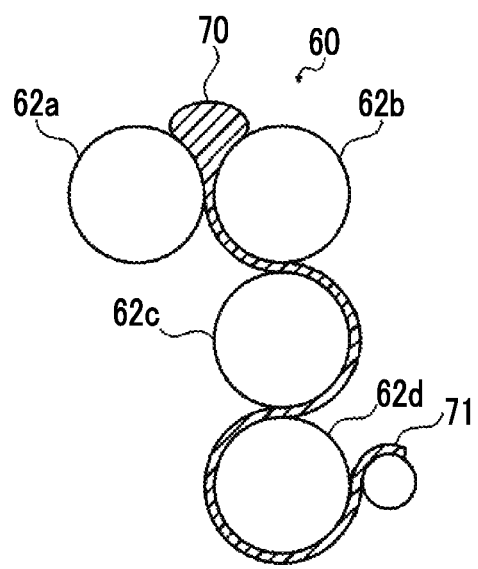
FIG. 6 is a view schematically showing calender rolls for preparing a flexo printing plate precursor.

Preferred examples of methods for forming the resin sheet include a method of preparing the resin composition for forming a resin sheet, removing a solvent from the resin composition if necessary, and then melt-extruding the resin composition onto a support, a method of preparing the resin composition for forming a resin sheet, casting the resin composition onto a support, and removing a solvent by heating and drying the cast resin composition in an oven or the like, and a method of molding the resin composition into a sheet-shaped material by using calender rolls shown in FIG. 6.

In FIG. 6, calender rolls 60 have first to fourth rolls 62a to 62d, and the gap between the rolls, the roll temperature, and the rotation rate of the rolls can he set. By setting a kneaded material 70 between the rolls and molding the material by rolling, a resin sheet 71 can be obtained.

<Support>

In a case where a support is used for forming the resin sheet, the material used in the support is not particularly limited as long as the material can be mounted on a printing cylinder. However, materials having high dimensional stability are preferably used, and examples thereof include a metal such as steel, stainless steel, or aluminum; a plastic resin such as polyester (for example, polyethylene terephthalate (PET), polybutylene terephthalate (PBT), or polyacrylonitrile (PAN)), or polyvinyl chloride; synthetic rubber such as styrene-butadiene rubber; and a plastic resin (such as an epoxy resin or a phenol resin) reinforced with glass fiber. As the support, a PET film or a steel substrate is preferably used.

The resin composition for forming a resin sheet used in the present invention can be manufactured by, for example, dissolving or dispersing a polymer having a monomer unit derived from diene-based hydrocarbon, a polymerizable compound, aromatics, a plasticizer, and the like in an appropriate solvent and then dissolving a cross-linking agent, a polymerization initiator, a cross-linking accelerator, and the like therein. From the viewpoint of the ease of forming the resin sheet, the thickness accuracy of the obtained cylindrical printing plate precursor, and the handling of the resin sheet, at least a portion of the solvent component and preferably the entirety of the solvent component needs to be removed at the stage of manufacturing a cylindrical printing plate precursor. Therefore, as the solvent, an organic solvent having appropriate volatility is preferable.

Next, the components contained in the resin sheet and the resin composition for forming a resin sheet will be described.

(Polymer Having Monomer Unit Derived from Diene-Based Hydrocarbon)

It is preferable that the resin sheet used in the present invention contains a polymer having a monomer unit derived from diene-based hydrocarbon (hereinafter, referred to as "specific polymer" as well) as an essential component.

The weight-average molecular weight of the specific polymer is preferably 5,000 to 1,600,000, more preferably 10,000 to 1,000,000, and even more preferably 15,000 to 600,000. In a ease where the weight-average molecular weight is equal to or greater than 5,000, the shape retaining properties of the polymer as a simple resin becomes excellent. It is preferable that weight-average molecular weight is equal to or less than 1,600,000, because then the polymer easily dissolves in a solvent, and it is easy to prepare a resin composition for laser engraving.

In the present invention, the weight-average molecular weight is measured by a gel permeation chromatography (GPC) and expressed in terms of standard polystyrene. Specifically, for example, for GPC, HLC-8220 GPC (manufactured by Tosoh Corporation), three columns consisting of TSKgeL Super HZM-H, TSKgeL Super HZ4000, and TSKgeL Super HZ 2000 (manufactured by Tosoh Corporation, 4.6 mm×15 cm), and tetrahydrofuran (THF) as an eluent are used. Furthermore. GPC is performed using an IR detector under the conditions of a sample concentration of 0.35% by mass, a flow rate of 0.35 ml/min, sample injection amount of 10 μL, and a measurement temperature of 40° C. In addition, a calibration curve is prepared from 8 samples of "Standard Sample TSK standard, polystyrene" manufactured by Tosoh Corporation: "F-40", "F-20", "F-4", "F-1", "A-5000", "A-2500", "A-1000", and "n-propylbenzene".

The specific polymer may be a specific polymer having a monomer unit derived from unconjugated diene-based hydrocarbon, but is preferably a specific polymer having a monomer unit derived from conjugated diene-based hydrocarbon.

(Specific Polymer Having Monomer Unit Derived from Conjugated Diene-Based Hydrocarbon)

Preferred examples of the specific polymer having a monomer unit derived from conjugated diene-based hydrocarbon include a polymer obtained by polymerizing conjugated diene-based hydrocarbon, a copolymer obtained by polymerizing conjugated diene-based hydrocarbon with other unsaturated compound are preferably with a monoolefin-based unsaturated compounds, and the like. The aforementioned polymer or copolymer may be modified. For example, a reactive group such as (meth)acryloyl group may he introduced into the terminal thereof, or a portion of the internal olefin may be hydrogenated in the following description, the polybutadiene in which a portion of the internal olefin is hydrogenated will be referred to as "partially hydrogenated polybutadiene" as well, and the polyisoprene in which a portion of the internal olefin is hydrogenated likewise will be referred to as "partially hydrogenated polyisoprene" as well. The copolymer is not particularly limited, and may be a random polymer, a block copolymer, or a graft polymer.

Specific examples of the aforementioned conjugated diene-based hydrocarbon include 1,3-butadiene, isoprene, and the like. One kind of these compounds are used singly, or two or more kinds thereof are used in combination.

Specific examples of the aforementioned monoolefin-based unsaturated compounds include styrene, α-methylslyene, o-methylstyrene, p-methylstyrene, isobutene, vinyl chloride, vinylidene chloride, (meth)acrylamide, (meth)acrylamide vinyl acetate, (meth)acrylic acid ester, (meth)acrylic acid, and the like.

The polymer obtained by polymerizing conjugated diene-based hydrocarbon or the copolymer obtained by polymerizing conjugated diene-based hydrocarbon with a monoolefin-based unsaturated compound is not particularly limited, and specific examples thereof include a butadiene polymer, an isoprene polymer, a styrene-butadiene copolymer, a styrene-isoprene copolymer, an acrylic acid ester-isoprene copolymer, a copolymer of methacrylic acid ester and the aforementioned conjugated diene, an acrylonitrile-butadiene-styrene copolymer, a styrene-isoprene-styrene block copolymer, a styrene-butadiene-styrene block copolymer, an isobutene-isoprene copolymer (butyl rubber), and the like.

These polymers may be subjected to emulsion polymerization or solution polymerization.

In the present invention, the specific polymer may have an ethylenically unsaturated group on the terminal thereof, and may have a partial structure represented by the following Formula (A-1),

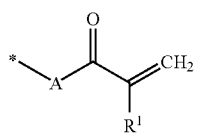

(A-1)

(In Formula (A-1), $R^1$ represents a hydrogen atom or a methyl group, A represents O or NH, and * represents a binding position in which the structure is bonded to other structures.)

In Formula (A-1), A preferably represents O.

That is, the specific polymer may have a (meth)acryloyloxy group or a (meth)acrylamide group in a molecule. The specific polymer more preferably has a (meth)acryloyloxy group.

The specific polymer may have the partial structure represented by Formula (A-1) on the terminal of a main chain or in a side chain. It is preferable that the specific polymer has the partial structure of the terminal of the main chain.

From the viewpoint of printing durability, it is preferable that the specific polymer has two or more partial structures represented by Formula (A-1) in a molecule.

Examples of the specific polymer having the partial structure represented by Formula (A-1) include polyolefin (meth)acrylate obtained by reacting a hydroxyl group of a hydroxyl group-containing polyolefin with an ethylenically unsaturated group-containing compound (for example, BAC-45 (manufactured by OSAKA ORGANIC CHEMICAL INDUSTRY LTD), TEA-1000, TE-2000, EMA-3000 (manufactured by NIPPON SODA CO., LTD.)), such as polybutadiene di(meth)acrylate, partially hydrogenated polybutadiene di(meth)acrylate, polyisoprene di(meth)acrylate, and partially hydrogenated polyisoprene (meth)acrylate.

Examples of the specific polymer also preferably include modified polyolefin obtained by modifying polyolefin such that an ethylenically unsaturated bond is introduced into the polyisoprene (for example, methacrylate-introduced polyolefin (KURAPRENE UC-203 and UC-102 (manufactured by KURARAY CO., LTD.)).

(Polymer Having Monomer Unit Derived From Butadiene and/or Isoprene)

In the present invention, it is preferable that the specific polymer is a polymer having a monomer unit derived from butadiene and/or isoprene.

Specific examples of the polymer include polybutadiene (butadiene rubber), partially hydrogenated polybutadiene, terminal-modified polybutadiene, polyisoprene (isoprene rubber), partially hydrogenated polyisoprene, terminal-modified polyisoprene, styrene-butadiene rubber (SBR), a styrene-butadiene-styrene triblock copolymer (SBS), an acrylonitrile-butadiene-styrene copolymer (ABS), a styrene-isoprene-styrene triblock copolymer (SIS), an isoprene/butadiene copolymer, and the like.

"Terminal-modified" means that the terminal of the main chain or the side chain is modified with an amide group, a carboxyl group, a hydroxyl group, a (meth)acryloyl group, a glycidyl group, or the like.

Among these, polybutadiene, partially hydrogenated polybutadiene, hydroxyl group-terminated polybutadiene, glycidyl ether-modified polybutadiene, polyisoprene, partially hydrogenated polyisoprene, terminal-modified polyisoprene, hydroxyl group-terminated polyisoprene, glycidyl ether-modified polyisoprene, SBS, and SIS are preferable.

The proportion of the monomer unit derived from butadiene, isoprene, or hydrogenated butadiene or isoprene is preferably equal to or higher than 30 mol % in total, more preferably equal to or higher than 50 mol % in total, and even more preferably equal to or higher than 80 mol % in total.

It is known that isoprene is polymerized by 1,2-, 3,4-, or 1,4-addition depending on the catalyst or the reaction condition. In the present invention, the polyisoprene polymerized by any of the aforementioned addition pathways may be used. From the viewpoint of obtaining desired elasticity, it is particularly preferable that the specific polymer contains cis-1,4-polyisoprene as a main component. In a case where the specific polymer is polyisoprene, the content of the cis-1,4-polyisoprene is preferably equal to or greater than 50% by mass, more preferably equal to or greater than 65% by mass, even more preferably equal to or greater than 80% by mass, and particularly preferably equal to or greater than 90% by mass.

As the polyisoprene, natural rubber may be used. Furthermore, commercially available polyisoprene can be used, and examples thereof include a NIPOL IR series (manufactured by ZEON CORPORATION).

It is known that butadiene is polymerized by 1,2- or 1,4-addition depending on the catalyst or the reaction condition. In the present invention, the polybutadiene polymerized by any of the aforementioned addition pathways may be used. From the viewpoint of obtaining desired elasticity, it is more preferable that the specific polymer contains 1,4-polybutadiene as a main component.

In a case where the specific polymer is polybutadiene, the content of 1,4-polybutadiene is preferably equal to or greater than 50% by mass, more preferably equal to or greater than 65% by mass, even more preferably equal to or greater than 80% by mass, and particularly preferably equal to or greater than 90% by mass.

The content of a cis-isomer or a trans-isomer is not particularly limited. From the viewpoint of expressing rubber elasticity, a cis-isomer is preferable. The content of cis-1,4-polybutadiene is preferably equal to or greater than 50% by mass, more preferably equal to or greater than 65% by mass, even more preferably equal to or greater than 80% by mass, and particularly preferably equal to or greater than 90% by mass.

As polybutadiene, commercially available products may be used, and examples thereof include an NIPOL BR series (manufactured by ZEON CORPORATION), a UBEPOL BR series (manufactured by UBE INDUSTRIES, LTD.), and the like.

(Specific Polymer Having Monomer Unit Derived from Unconjugated Diene-Based Hydrocarbon)

The specific polymer may be a specific polymer having a monomer unit derived from unconjugated diene-based hydrocarbon, Examples of the specific polymer preferably include a copolymer obtained by polymerizing unconjugated diene-based hydrocarbon with other unsaturated compounds and preferably with an α olefin-based unsaturated compound, and the like. The copolymer is not particularly limited, and may be a random polymer, a block copolymer, or a graft polymer.

Specific examples of the unconjugated diene-based hydrocarbon include dicyclopentadiene, 1,4-hexadiene, cyclooctadiene, methylene norbornene, ethylidene norbornene, and the like. Among these, dicyclopentadiene and ethylidene norbornene are preferable, and ethylidene norbornene is more preferable. These compounds are used singly, or two or more kinds thereof are used in combination.

Specific examples of the aforementioned monoolefin-based unsaturated compound include α-olefin having 2 to 20 carbon atoms such as ethylene, propylene, 1-butene, 1-hexene, and 4-methyl-pentene. Among these, ethylene and propylene are preferable, it is more preferable to use ethylene and propylene in combination. These compounds are used singly or used in combination of two or more kinds thereof.

The polymer obtained by polymerizing the conjugated diene-based hydrocarbon or the copolymer obtained by polymerizing conjugated diene-based hydrocarbon with an α-olefin-based unsaturated compound is not particularly limited. As the polymer or the copolymer, an ethylene-α olefin-diene copolymer is preferable, and ethylene-propylene-diene rubber (EPDM) is more preferable.

Among the above, as the specific polymer, styrene-butadiene rubber, butadiene rubber, isoprene rubber, or ethylene-propylene-diene rubber is preferable, and butadiene rubber is more preferable.

The specific polymer is preferably a polymer in which the main chain mainly contains isoprene or butadiene as a monomer unit. Furthermore, a portion of the specific polymer may be hydrogenated and converted into a saturated bond. In addition, the middle or the terminal of the main chain of the polymer may be modified with amide, a carboxyl group, a hydroxyl group, a (meth)acryloyl group, or the like or may be epoxidated.

Among the above examples, as the specific polymer, from the viewpoint of solubility in a solvent or handleability, polybutadiene, polyisoprene, and an isoprene/butadiene copolymer are preferable, polybutadiene and polyisoprene are more preferable, and polybutadiene is even more preferable.

From the viewpoint of expressing flexibility and rubber elasticity, the glass transition temperature (T g) of the specific polymer is preferably equal to or lower than 20° C.

The glass transition temperature of the specific polymer is measured according to JIS K 7121-1987 by using a differential scanning calorimeter (DSC).

In a case where the specific polymer has two or more glass transition temperatures, it is preferable that at least one of them is equal to or lower than 20° C. It is more preferable that all of the glass transition temperatures are equal to or lower than 20° C.

In the present invention, the SP value of the specific polymer is preferably 14.0 to 18.0 $MPa^{1/2}$, more preferably 15.0 to 17.5 $MPa^{1/2}$, and even more preferably 16.0 to 17.5 $MPa^{1/2}$.

The SP value equals the square root of cohesive energy density of a molecule. The SP value shows the magnitude of intermolecular cohesive three, and is a parameter of polarity.

It is preferable that the SP value is within the above range, because then appropriate adhesiveness with respect to a urethane-based adhesive is obtained.

The SP value is calculated based on the Okitsu method described in The Journal of The Adhesion Society of japan, 29(3), 1993, 204-211.

The specific polymer is preferably an elastomer or a plastomer. In a case where the specific polymer is an elastomer or a plastomer, when a printing plate precursor for laser engraving obtained from the specific polymer is made into a sheet-like precursor or a cylindrical precursor, excellent thickness accuracy or dimensional accuracy can be achieved. Furthermore, it is preferable that the specific polymer is an elastomer or a plastomer, because then necessary elasticity can be imparted to the flexo printing plate.

In the present invention, "plastomer" means a polymer substance having the properties of easily performing flow deformation by heating and of being able to be solidified into the deformed shape by cooling, as describe in "New Edition of Polymer Dictionary" (The Society of Polymer Science, Japan, Asakura Publishing Co., Ltd., 1988). "Plastomer" is a term of contrast to "elastomer" (a substance having the properties of being instantaneously deformed according to an external force when an external force is applied thereto and restoring the original shape in a short time when the external force is removed). The plastomer is a substance which does not perform elastic deformation unlike the elastomer while easily performs plastic deformation.

In the present invention, the plastomer means a substance which can be deformed such that the size thereof increases up to 200% with small external force at room temperature (20° C.) provided that the original size of the plastomer is regarded as being 100%, and does not shrink to such a degree that the size becomes equal to or less than 130% even when the external force is removed. The small force specifically refers to the external force at which the tensile strength becomes 1 to 100 MPa. More specifically, the plastomer means a substance having properties in which, in a case where a dumbbell-shaped No. 4 test piece specified in JIS K 6251-1993 is used based on the permanent set testing methods of JIS K 6262-1997, in a tensile test performed at 20° C., the test piece can be elongated without breakage, until the distance between marker lines marked before the tensile test doubles; and in a case where the test piece is held as is for 60 minutes at a point in time when the distance between marker lines marked before the tensile test doubles, the external tensile force is removed, and then the test piece is allowed to stand for 5 minutes, the tensile permanent set measured at this time is equal to or higher than 30%. In the present invention, all of the testing conditions were based on the permanent set testing methods of JIS K 6262-1997, except that the dumbbell-shaped No. 4 test piece specified in JIS K 6251-1993 was used, the holding time was set to be 60 minutes, and the temperature of the testing worn was set to he 20° C.

A polymer which cannot be measured in the aforementioned method, that is, a polymer which is deformed even if external tensile force is not applied thereto and does not restore its original shape in a tensile, test or a polymer which is broken when the small external force used at the time of measurement described above is applied thereto corresponds to the plastomer.

In the present invention, the glass transition temperature (Tg) of the polymer plastomer is less than 20° C. In a case where the polymer has two or more Tg's, all of Tg's are less than 20° C. Tg of the polymer can be measured by differential scanning, calorimetry (DSC).

In the present invention, "elastomer" means a polymer which can be elongated until the distance between marker lines doubles in the aforementioned tensile test and having a tensile permanent set, measured 5 minutes after the external tensile force is removed, of less than 30%.

The viscosity of the specific polymer of the present invention measured at 20° C. is preferably 10 Pa·s to 10 kPa·s, and more preferably 50 Pa·s to 5 kPa·s. In a case where the viscosity is within the above range, the resin composition is easily molded into a sheet-shaped material, and the process becomes simple. In the present invention, in a case where the specific polymer is a plastomer, when the resin composition for forming a resin sheet is molded into a sheet-shaped material, excellent thickness accuracy or dimensional accuracy can be achieved.

In the present invention, one kind of the specific polymer may be used singly, or two or more kinds thereof may be used in combination.

The total content of the specific polymer in the resin sheet used in the present invention is, with respect to the total mass of the solid content of the resin sheet, preferably 5% to 90% by mass, more preferably 15% to 85% by mass, and even more preferably 30% to 80% by mass.

The total content of the specific polymer in the resin composition for forming a resin sheet used in the present invention is, with respect to the total mass of the solid content of the resin composition, preferably 5% to 90% by mass, more preferably 15% to 85% by mass, and even more preferably 30% to 80% by mass. In a case where the content of the specific polymer is equal to or greater than 5% by mass, printing durability enough for the obtained cylindrical printing plate to be used as a printing plate is obtained. In a case where the content of the specific polymer is equal to or less than 90% by mass, the amount of other components does not become insufficient, and flexibility enough for the prepared cylindrical printing plate to be used as a printing plate can be obtained.

"Total mass of the solid content" means the total mass determined when volatile components such as a solvent are excluded from the resin sheet or the resin composition for forming a resin sheet.

It is preferable that the resin sheet and the resin composition for forming a resin sheet used in the present invention contains a polymerization initiator, a photothermal conversion agent, a solvent, and other components. Hereinafter, these components will be specifically described.

(Polymerization Initiator)

In the present invention, it is preferable that the resin composition for laser engraving is formed using the resin composition for forming a resin sheet containing a polymerization initiator. In a case where the resin composition for forming a resin sheet contains a polymerization initiator, the cross-linking of the specific polymer and the ethylenically unsaturated bonds contained in the polymerizable compound which will he described later is accelerated.

As the polymerization initiator, the compounds known to those in the related art can be used without limitation. Although any of a photopolymerization initiator and a thermal polymerization initiator can be used, a thermal polymerization initiator is preferable because this compound makes it possible to form a cross-link by using a simple device. Hereinafter, a radical polymerization initiator as a preferred polymerization initiator will be specifically described, but the present invention is not limited thereto.

In the present invention, specific examples of preferred polymerization initiators include (a) aromatic ketones, (b) onium salt compound, (c) organic peroxide, (d) thio compound, (e) hexaaryl biimidazole compound, (f) ketoxime ester compound, (g) borate compound, (h) azinium compound, (i) metallocene compound, (j) active ester compound, (k) carbon-halogen bond-containing compound, (l) azo-based compound, and the like. Specific examples of (a) to (l) will be shown below, but the present invention is not limited thereto.

In the present invention, from the viewpoint of improving the engraving sensitivity and the relief edge shape when the composition is used for a resin sheet, (c) organic peroxide and (l) azo-based compound are more preferable, and (c) organic peroxide is particularly preferable.

As (a) aromatic ketones, (b) onium salt compound, (d) thio compound, (e) hexaaryl biimidazole compound, (f) ketoxime ester compound, (g) borate compound, (h) azinium compound, (l) metallocene compound, (j) active ester compound, and (k) carbon-halogen bond-containing compound described above, the compounds exemplified in paragraphs [0074] to [0118] in JP2008-63554A can be preferably used.

As (c) organic peroxide and (l) azo-based compound, the following compounds are preferable.

(c) Organic Peroxide

As (c) organic peroxide preferred as the thermal polymerization initiator which can be used in the present invention, peroxyester-based compounds such as 3,3'4,4'-tetra(t-butylperoxycarbonyl)benzophenone, 3,3'4,4'-tetra(t-amylperoxycarbonyl)benzophenone, 3,3'4,4'-tetra(t-hexylperoxycarbonyl)benzophenone, 3,3'4,4'-tetra(t-octylperoxycarbonyl)benzophenone, 3,3'4,4'-tetra(cumylperoxycarbonyl)benzophenone, 3,3'4,4'-tetra(p-isopropylcumylperoxycarbonyl)benzophenone, di-t- butyldiperoxyisophthalate, t-butylperoxybenzoate, t-butylperoxy-3-methylbenzoate, t-butylperoxylaurate, t-butylperoxypivalate, t-butylperoxy-2-ethylhexancate, t-butylperoxy-3,5,5-trimethylhexanoate, t-butylperoxyneoheptanoate, t-butylperoxyneodecanoate, t-butylperoxyacetate, α,α'-di(t-butylperoxy)diisopropylbenzene, t-butylcumylperoxide, di-t-butylperoxide, t-butylperoxyisopropylmonocarbonate, and t-butylperoxy-2-ethylhexylmonocarbonate are preferable. Among these, from the viewpoint of excellent compatibility, t-butylperoxybenzoate is particularly preferable.

(l) Azo-Based Compound

Examples of (l) azo-based compound preferred as the polymerization initiator which can be used in the present invention include 2,2'-azobisisobutyronitrile, 2,2'-azobispropionitrile, 1,1'-azobis(cyclohexane-1-carboninitrile), 2,2'-azobis(2-methylbutyronitrile), 2,2'-azobis(2,4-dimethylvaleronitrile), 2,2'-azobis(4-methoxy-2,4-dimethylvaleronitrile), 4,4'-azobis(4-cyanovalerate), dimethyl 2,2'-azobisisobutyrate, 2,2'-azobis(2-methylpropionamidoxime), 2,2'-azobis[2-(2-imidazolin-2-yl)propane], 2,2'-azobis{2-methyl-N-[1,1-bis(hydroxymethyl)-2-hydroxyethyl]propionamide}, 2,2'-azobis[2-methyl-N-(2-hydroxyetnyl)propionamide], 2,2'-azobis(N-butyl-2-methylpropionamide), 2,2'-azobis(N-cyclohexyl-2-methylpropionamide), 2,2'-azobis[N-(2-propenyl)-2-methylpropionamide], 2,2'-azobis(2,4,4-trimethylpentane), and the like.

In the present invention, from the viewpoint of improving the cross-linking properties of the resin sheet and the engraving sensitivity, (c) organic peroxide described above is particularly preferred as the polymerization initiator used in the present invention.

From the viewpoint the engraving sensitivity, an aspect is particularly preferable in which (c) organic peroxide is combined with the photothermal conversion agent which will be described later.

When the resin sheet is cured through thermal cross-linking by using an organic peroxide, the unreacted organic peroxide not being involved in the generation of a radical remains. The remaining organic peroxide functions as a self-reactive additive and is decomposed in an exothermic way at the time of laser engraving. Presumably, as a result, the released heat may be added to the radiated laser energy, and hence the engraving sensitivity may be improved.

The aforementioned effect is markedly exhibited in a case where carbon black is used as the photothermal conversion agent for the following reason, although the mechanism will be specifically explained later in the description of the photothermal conversion agent. It is considered that the heat generated from carbon black may also be transferred to (c) organic peroxide, and as a result, heat may be released not only from carbon black but also from the organic peroxide, and hence the thermal energy supposed to be used for the decomposition of the specific polymer or the like may be synergistically generated.

In the present invention, only one kind of polymerization initiator may he used, or two or more kinds thereof may be used in combination.

The content of the polymerization initiator in the resin sheet used in the present invention is, with respect to the total mass of the solid content, preferably 0.01% to 30% by mass, more preferably 0.1% to 20% by mass, and even more preferably 1% to 15% by mass.

It is preferable that the content of the polymerization initiator in the resin composition for forming a resin sheet used in the present invention is, with respect to the total mass of the solid content, preferably 0.01% to 30% by mass, more preferably 0.1% to 20% by mass, and even more preferably 1% to 15% by mass. It is preferable that the content is within the above range, because then the curing properties (cross-linking properties) become excellent, the relief edge shape obtained at the time of laser engraving becomes excellent, and the rinsing properties become excellent.

(Photothermal Conversion Agent)

It is preferable that the resin sheet and the resin composition for forming a resin sheet used in the present invention further contain a photothermal conversion agent. That is, it is considered that, by absorbing the laser light and releasing heat, the photothermal conversion agent in the present invention may accelerate the thermal decomposition of the cured material at the time of laser engraving. Therefore, it is preferable to select a photothermal conversion agent that absorbs light having the wavelength of the laser used for engraving.

In a case where a laser (a YAG laser, a semiconductor laser, a fiber laser, a surface emitting laser, or the like) emitting infrared rays at 700 nm to 1,300 nm is used as a light source for laser-engraving the resin sheet used in the present invention, it is preferable to use a compound having a maximum absorption wavelength at 700 to 1,300 nm as the photothermal conversion agent.

In the present invention, various dyes or pigments are used as the photothermal conversion agent.

Among the photothermal conversion agents, as dyes, commercially available dyes and known dyes described in documents such as "Dye Handbook" (edited by The Society of Synthetic Organic Chemistry, Japan, 1970) can be used. Specific examples thereof include dyes having a maximum absorption wavelength at 700 to 1,300 nm. Examples thereof preferably include dyes such as an azo dye, a metal complex salt azo dye, pyrazolone azo dye, a naphthoquinone dye, an anthraquinone dye, a phthalocyanine dye, a carbonium dye, a diimonium compound, a quinoneimine dye, a methine dye, a cyanine dye, a squarylium dye, a pyrylium salt, and a metal thiolate complex. Examples of dyes which can be preferably used in the present invention include a cyanine-based dye such as a heptamethine cyanine dye, an oxonol-based dye such as pentamethine oxonol dye, a phthalocya.nine-based dye, and the dyes described in paragraphs[0124] to [0137] in JP2008-63554A.

Among the photothermal conversion agents used in the present invention, as pigments, commercially available pigments and the pigments described in the color index (C. I.) handbook, "Latest Pigment Handbook" (edited by The Society of Pigment Technology, Japan, 1977), "Latest Application Technology of Pigment" (published by CMC Publishing Co., Ltd., 1986), and "Printing Ink Technology" (published by CMC Publishing Co., Ltd., 1984) can he used. Furthermore, as pigments, the pigments described in paragraphs [0122] to [0125] in JP2009-178869A can be exemplified.

Among these pigments, carbon black is preferable.

Any type of carbon black including, those graded by ASTM can be used regardless of the purpose (for example, carbon black for coloring, rubber, batteries, and the like) as long as the dispersibility thereof in the composition is stable. Carbon black includes, for example, furnace black, thermal black, channel black, lamp black, acetylene black, and the like. Herein, a black colorant such as carbon black is easily dispersed. Therefore, if necessary, carbon black can be used in the form of a color chip or color paste obtained by dispersing in advance the pigment in nitrocellulose, a binder, or the like by using a dispersant. The chip or paste is easily available as commercial products. Examples of carbon black also include those described in paragraphs [0130] to [0134] in JP2009-178869A.

In the resin sheet and the resin composition for forming a resin sheet used in the present invention, only one kind of photothermal conversion agent may be used, or two or more kinds of thereof may be used in combination.

The content of the photothermal conversion agent in the resin sheet greatly varies with the magnitude of a molecular extinction coefficient inherent to the molecule of the photothermal conversion agent. However, the content of the photothermal conversion agent is preferably within a range of 0.01% to 30% by mass, more preferably 0.05% to 20% by mass, and particularly preferably 0.1% to 10% by mass of the total mass of the solid content.

The content of the photothermal conversion agent in the resin composition for forming a resin sheet greatly varies with the magnitude of a molecular extinction coefficient inherent to the molecule of the photothermal conversion agent. However, the content of the photothermal conversion agent is preferably within a range of 0.01% to 30% by mass, more preferably 0.05% to 20% by mass, and particularly preferably 0.1% to 10% by mass of the total mass of the solid content.

(Solvent)

The resin composition for forming a resin sheet used in the present invention may contain a solvent.

It is preferable to use an organic solvent as the solvent.

Specific examples of preferred aprotic organic solvents include acetonitrile, tetrahydrofuran, dioxane, toluene, propylene glycol monomethyl ether acetate, methyl ethyl ketone, acetone, methyl isobutyl ketone, ethyl acetate, butyl acetate, ethyl lactate, N,N-dimethylacetamide, N-methylpyrrolidone, and dimethyl sulfoxide.

Specific examples of preferred organic protic solvents include methanol, ethanol, 1-propanol, 2-propanol, 1-butanol, 1-methoxy-2-propanol, ethylene glycol, diethylene glycol, and 1,3-propanediol.

Among these, propylene glycol monomethyl ether acetate is particularly preferable.

(Other Additives)

Various known additives can be appropriately mixed with the resin sheet and the resin composition for forming a resin sheet used in the present invention, within a range that does not impair the effects of the present invention. Examples of the additives include a cross-linking agent, a cross-linking accelerator, a plasticizer, a filler, wax, process oil, a metal oxide, an antiozonant, an antioxidant, a polymerization inhibitor, a coloring agent, and the like. One kind of these additives may be used singly, or two or more kinds thereof may be used in combination.

(Polymerizable Compound)

In order to accelerate the formation of a cross-linked structure, the resin sheet used in the present invention can be formed using the resin composition for forming a resin sheet containing a polymerizable compound, in a case where the resin composition contains a polymerizable compound, the formation of a cross-linked structure is accelerated, and the printing durability of the obtained cylindrical printing plate becomes excellent.

The aforementioned specific polymer having an ethylenically unsaturated group is not included in the polymerizable compound.

The polymerizable compound is preferably a compound having a molecular weight less than 3,000, and more preferably a compound having a molecular weight less than 1,000.

The polymerizable compound is preferably a radically polymerizable compound or an ethylenically unsaturated compound.

The polymerizable compound used in the present invention is preferably a polyfunctional ethylenically unsaturated compound. In a case where the above aspect is adopted, the printing durability of the obtained cylindrical printing plate is further improved.

As the polyfunctional ethylenically unsaturated compound, the compounds having 2 to 20 ethylenically unsaturated groups on the terminal are preferable. A group of these compounds is widely known in the field of the related art, and can be used in the present invention without particular limitation.

Examples of compounds from, which the ethylenically unsaturated group in the polyfunctional ethylenically unsaturated compound is derived include unsaturated carboxylic acid (for example, acrylic acid, methacrylic acid, itaconic acid, crotonic acid, isocrotonic acid, or maleic acid) and esters or amides thereof. Among these, esters of unsaturated carboxylic acid and an aliphatic polyhydric alcohol compound and amides of unsaturated carboxylic acid and an aliphatic polyvalent amine compound are preferably used. Furthermore, a product of an addition reaction between an unsaturated carboxylic acid ester having a nucleophilic substituent such as a hydroxyl group or an amino group, amides, polyfunctional isocyanates, and epoxies, a product of a dehydrocondensation reaction with polyfunctional carboxylic acid, and the like are suitably used. In addition, a product of an addition reaction between an unsaturated carboxylic acid ester having an electrophilic substituent such as an isocyanate group or an epoxy group, amides, monofunctional or polyfunctional alcohols, and amines, and a product of a substitution reaction between an unsaturated carboxylic acid ester having a leaving substituent such as a halogen group or a tosyloxy group, amides, monofunctional or polyfunctional alcohols, and amines are suitable. As another example, instead of the aforementioned unsaturated carboxylic acid, it is possible to use a group of compounds substituted with a vinyl compound, an allyl compound, unsaturated sulfonic acid, styrene, or the like.

From the viewpoint of reactivity, the ethylenically unsaturated group contained in the polymerizable compound is preferably a residue of acrylate, methacrylate, a vinyl compound, or an allyl compound. Furthermore, from the viewpoint of printing durability, the polyfunctional ethylenically unsaturated compound more preferably has 3 or more ethylenically unsaturated groups.

Specific examples of monomers of esters of an aliphatic polyhydric alcohol compound and unsaturated carboxylic acid include acrylic acid esters such as ethylene glycol diacrylate, diethylene glycol diacrylate, triethylene glycol diacrylate, polyethylene glycol diacrylate, 1,3-butanediol diacrylate, tetramethylene glycol diacrylate, propylene glycol diacrylate, dipropylene glycol diacrylate, tripropylene glycol diacrylate, polypropylene glycol diacrylate, neopentyl glycol diacrylate, 1,6-hexanediol diacrylate, 1,4-cyclohexanediol diacrylate, tetraethylene glycol diacrylate, polytetramethylene glycol diacrylate, 1,8-octanediol diacrylate, 1,9-nonanediol diacrylate, 1,10-decanediol diacrylate, tricyclodecanedimethanol diacrylate, trimethylolpropane triacrylate, trimethylolpropane tri(acryloyloxypropyl)ether, ditrimethylolpropane tetraacrylate, trimethylolethane triacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaaerylate, tri(acryloyloxyethyl)isocyanurate, and a polyester acrylate oligomer.

Specific examples of the aforementioned monomers include methacrylic acid esters such as tetramethylene glycol dimethacrylate, ethylene glycol dimethacrylate, diethylene glycol dimethacrylate, triethylene glycol dimethacrylate, polyethylene glycol dimethacrylate, propylene glycol dimethacrylate, dipropylene glycol dimethacrylate, tripropylene glycol dimethacrylate, polypropylene glycol dimethacrylate, neopentyl glycol dimethacrylate, trimethylolpropane trimethacrylate, trimethylolethane trimethacrylate, 1,3-butanediol dimethacrylate, 1,6-hexanediol dimethacrylate, 1,8-octanediol dimethacrylate, 1,9-nonanediol dimethacrylate, 1,10-decanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2-hydroxypropoxy)phenyl]dimethyl methane, and bis[p-(methacryloxyethoxy)phenyl]dimethyl methane. Among these, trimethylolpropane trimethacrylate and polyethylene glycol dimethacrylate are particularly preferable.

Specific examples of the aforementioned monomers include itaconic acid esters such as ethylene glycol diitaconate, propylene glycol diitaconate, 1,3-butanediol diitaconate, 1,4-butanediol diitaconate, tetramethylene glycol diitaconate, pentaerythritol diitaconate, and sorbitol tetraitaconate.

Specific examples of the aforementioned monomers include crotonic acid esters such as ethylene glycol dicrotonate, tetramethylene glycol dicrotonate, pentaerythritol dicrotonate, and sorbitol tetracrotonate.

Specific examples of the aforementioned monomers include isocrotoinc acid esters such as ethylene glycol diisocrotonate, pentaerythritol diisocrotonate, and sorbitol tetraisocrotonate.

Specific examples of the aforementioned monomers include maleic acid esters such as ethylene glycol dimaleate, triethylene glycol dimaleate, pentaerythritol dimaleate, and sorbitol tetramaleate.

As other esters, for example, the aliphatic alcohol-based esters described in JP1971-27926B (JP-S46-27926B), JP1976-47334B (JP-S51-47334B), and JP1982-196231A (JP-S57-196231A), the esters having an aromatic skeleton described in JP1984-5240A (JP-S59-5240A), JP1984-5241A (JP-S59-5241A), and JP1990-226149A (JP-H02-226149A), the amino group-containing esters described in JP1989-165613A (JP-H01-165613A), and the like are suitably used.

The aforementioned ester monomers can be used as a mixture.

Specific examples of monomers of an amide of an aliphatic polyvalent amine compound and unsaturated carboxylic acid include methylene bisacrylamide, methylene bismethacrylamide, 1,6-hexamethylenebis-acrylamide, 1,6-hexamethylenebismethacrylamide, diethylene triamine trisacrylamide, xylylene bisacrylamide, xylylene bismethacrylamide, and the like.

Examples other preferred amide-based monomers include the monomers having a cyclohexylene structure described in JP1979-21726B (JP-S54-21726B).

Furthermore, a urethane-based addition-polymerizable compound manufactured using an addition reaction of isocyanate and a hydroxyl group is also suitable. Specific examples of the compound include a vinyl urethane compound containing 2 or more polymerizable vinyl groups in one molecule that is obtained by adding a hydroxyl group-containing vinyl monomer represented by the following Formula (i) to a polyisocyanate compound having 2 or more isocyanate groups in one molecule that is described in JP1973-41708B (JP-S48-41708B), and the like.

$$CH_2=C(R)COOCH_2CH(R')OH \qquad (i)$$

(R and R' each represent H or $CH_3$.)

In addition, the urethane acrylates described in JP1976-37193A (JP-S51-37193A), JP1990-32293B (JP-H02-32293B), and JP1990-16765B (JP-H02-16765B) and the urethane compounds having an ethylene oxide-based skeleton described in JP 1983-49860B (JP-S58-49860B), JP1981-17654B (JP-S56-17654B), JP1987-39417B (JP-S62-39417B), and JP1987-39418B (JP-S62-39418B) are also suitable.

By using the addition-polymerizable compounds having an amino structure in a molecule described in JP1988-2776534 (JP-S63-277653A), JP1988-260909A (JP-S63-260909A), and JP1989-1052384 (JP-H01-105238A), a curable composition can be obtained in a short time.

Examples of the aforementioned monomers also include polyfunctional acrylate or methacrylate such as the polyester acrylates described in JP1973-64183A (JP-S48-64183A), JP1974-43191B (JP-S49-43191B), and JP1977-30490B (JP-S52-30490B) and epoxy acrylates obtained by reacting an epoxy resin with (meth)acrylic acid, specific unsaturated compounds described in JP1971-43946B (JP-S46-43946B), JP1989-40337B (JP-H01-40337B), and JP1989-40336B (JP-H01-40336B), the vinyl phosphonate-based compound described in JP1990-25493A (JP-H02-25493A), and the like. In some cases, the structure containing a perfluoroalkyl group described in JP1986-22048A (JP-S61-22048A) is suitably used. Furthermore, it is possible to use those introduced as photocurable monomers and oligomers in The Journal of The Adhesion Society of Japan, vol. 20, No. 7, pp 300-308 (1984).

Examples of the vinyl compound include butanediol-1,4-divinyl ether, ethylene glycol divinyl ether, 1,2-propanediol divinyl ether, 1,3-propanediol divinyl ether, 1,3-butanediol divinyl ether, 1,4-butanediol divinyl ether, neopentyl glycol divinyl ether, trimethylolpropane trivinyl ether, trimethylolethane trivinyl ether, hexanediol divinyl ether, tetraethylene glycol divinyl ether, pentaerythritol divinyl ether, pentaerythritol trivinyl ether, pentaerythritol tetravinyl ether, sorbitol tetravinyl ether, sorbitol pentavinylether, ethylene glycol diethylene vinyl ether, ethylene glycol dipropylene vinyl ether, trimethylolpropane triethylene vinyl ether, trimethylolpropane diethylene vinyl ether, pentaerythritol diethylene vinyl ether, pentaerythritol triethylene vinyl ether, pentaerythritol tetraethylene vinyl ether, 1,1,1-tris[4-(2-vinyloxyethoxy)phenyl]ethane, bisphenol A divinyloxyethyl ether, divinyl adipate, and the like.

In the resin sheet used in the present invention and the resin composition used for forming the resin sheet, only one kind of polymerizable compound may be used, or two or more kinds thereof may be used in combination.

The content of the polymerizable compound in the resin sheet used in the present invention is, with respect to the total mass of the solid content of the resin composition, preferably 0.1% to 30% by mass, more preferably 0.5% to 20% by mass, and even more preferably 1% to 10% by mass.

The content of the polymerizable compound in the resin composition for fanning a resin sheet used in the present invention is, with respect to the total mass of the solid content of the resin composition, preferably 0.1% to 30% by mass, more preferably 0.5% to 20% by mass, and even more preferably 1% to 10% by mass. in a case where the content of the polymerizable compound is within the above range, the rising properties of engraving scum that occurs at the time of laser engraving are further improved, and the printing durability of the obtained cylindrical printing plate is further improved.

(Amount of Each Component Mixed In)

The total content of the specific polymer in the resin sheet is preferably 5% to 90% by mass with respect to the total mass of the solid content of the resin sheet used in the present invention. The content of the polymerization initiator in the resin sheet is preferably 0.01% to 30% by mass with respect to the total mass of the solid content of the resin sheet used in the present invention. The content of the photothermal conversion agent in the resin sheet is preferably within a range of 0.01% to 30% by mass with respect to the total mass of the solid content of the resin sheet used in the present invention. The content of the polymerizable compound is preferably 0% to 30% by mass with respect to the total mass of the solid content of the resin sheet used in the present invention.

The total content of the specific polymer in the resin composition for forming a resin sheet is preferably 5% to 90% by mass with respect to the total mass of the solid content of the resin composition for forming a resin sheet used in the present invention, The content of the polymerization initiator in the resin composition is preferably 0.01% to 30% by mass with respect to the total mass of the solid content of the resin composition for forming a resin sheet used in the present invention. The content of the photothermal conversion agent in the resin composition is preferably within a range of 0.01% to 30% by mass with respect to the total mass of the solid content of the resin composition for forming a resin sheet used in the present invention. The content of the polymerizable compound in the resin composition is preferably 0% to 30% by mass with respect to the total mass of the solid content of the resin composition for forming a resin sheet used in the present invention.

(Method for Curing Resin Sheet)

Hereinafter, a method for curing the resin sheet will be described.

The resin sheet used in the present invention is preferably a sheet cured by the action of heat and/or light.

In a case where the resin sheet used in the present invention contains a photopolymerization initiator, the resin sheet can be cured by being irradiated with light.

It is preferable that the entire surface of the resin sheet is irradiated with light.

Examples of light include visible light, ultraviolet light, and electron beams, and among these, ultraviolet light is most preferable. In a case where the support side of the resin sheet is regarded as a rear surface, only a front surface may be irradiated with light. However, in a case where the support is a transparent film that transmits light, it is preferable to irradiate the rear surface as well. In a case where the resin sheet includes a protective film, the front surface may be irradiated with light in the presence of the protective film or may be irradiated with light after the protective film is peeled off. In a case where there is a concern that the cross-linking reaction will be hindered in the presence of oxygen, the resin sheet may be irradiated with light after being covered with a vinyl chloride sheet and subjected to vacuuming.

In a case where the resin sheet contains a thermal polymerization initiator (the aforementioned photopolymerization initiator can be a thermal polymerization initiator), the resin sheet can be cured by heating (thermal cross-linking step). Examples of means for heating for performing thermal cross-linking include a method of heating the resin sheet in a hot air oven or an infrared oven for a certain period of time and a method of bringing the resin sheet into contact with a heated roll for a certain period of time.

As the method for curing the resin sheet, thermal cross-linking is preferable because this method enables the resin sheet to be uniformly cured (cross-linked) from the surface to the inside.

By the cross-linking of the resin sheet, first, an advantage that a relief formed after laser engraving becomes sharp, and second, an advantage m that pressure sensitive adhesiveness of the engraving scum that occurs at the time of laser engraving is suppressed are obtained.

If necessary, the method for manufacturing the flew printing plate may further include, after the engraving step, the following rinsing step, drying step, and/or post-cross-linking step.

Rinsing step: a step of rinsing the engraved surface of the engraved relief layer with water or a liquid containing water as a main component Drying step: a step of drying the engraved relief layer Post-cross-linking step: a step of further cross-linking the relief layer by applying energy to the engraved relief layer After the engraving step is performed, engraving scum is attached to engraved surface. Therefore, a rinsing step of washing off the engraving scum by rinsing the engraved surface with water or a liquid containing water as a main component may be added. Examples of means for rinsing include a method of performing rinsing with tap water; a method of spraying water at a high pressure; a method of brushing the engraving surface mainly in the presence of water by using a batch-type or transport-type brush-like rinsing machine known as a developing machine for a photosensitive resin letterpress; and the like. In a case where sliminess of the engraving scum is not removed, a rinsing solution to which soap or a surfactant is added may be used.

In a case where the rinsing step of rinsing the engraved surface is performed, it is preferable to add a drying step of drying the engraved recording layer so as to volatilize the rinsing solution.

Furthermore, if necessary, a post-cross-linking step of further cross-linking the engraved recording layer may be added. By performing the post-cross-linking step which is an additional cross-linking step, it is possible to toughen the relief formed by engraving.

The pH of the rinsing solution used in the rinsing step is preferably equal to or greater than 9, more preferably equal to or greater than 10, and even more preferably equal to or greater than 11. Furthermore, the pH of the rinsing solution is preferably equal to or less than 14, more preferably equal to or less than 13.5, and even more preferably equal to or less than 13.1. If the pH is within the above range, it is easy to handle the rinsing solution. In order to make the pH of the rinsing solution fail into the above range, the pH should be appropriately adjusted using an acid and/or a base, and the acid and base used arc not particularly limited.

It is preferable that the rinsing solution contains water as a main component. Furthermore, the rinsing solution may contain, as a solvent other than water, a water-miscible solvent such as alcohols, acetone, or tetrahydrofuran, It is preferable that the rinsing solution contains a surfactant. As the surfactant, from the viewpoint of engraving scum removability and reducing the influence on the flexo printing plate, a betaine compound (amphoteric surfactant) such as a carboxybetaine compound, a sulfobetaine compound, a phosphobetaine compound, an amine oxide compound, or a phosphine oxide compound is preferably exemplified. In the present invention, the N=O structure of an amine oxide compound and the P=O structure of a phosphine oxide compound are regarded as $N^+$—$O^-$ and $P^+$—$O^-$ respectively.

Examples of the surfactant also include known anionic surfactants, canonic surfactants, amphoteric surfactants, nonionic surfactants, and the like. Furthermore, nonionic surfactants based on fluorine and silicone can also be used.

One kind of surfactant may be used singly, or two or more kinds thereof may be used concurrently.

The amount of the surfactant used does not need to be particularly limited. However, it is preferably 0.01% by mass to 20% by mass, and more preferably 0.05% by mass to 10% by mass, with respect to the total mass of the rinsing solution.

From the viewpoint of satisfying various printing suitabilities such as abrasion resistance and ink transferability, the thickness of the relief layer (cured layer) included in the prepared flexo printing plate is preferably equal to or greater than 0.05 mm and equal to or less than 10 mm, more preferably equal to or greater than 0.05 mm and equal to or less than 7 mm, and particularly preferably equal to or greater than 0.05 mm and equal to or less than 3 mm.

The Shore A hardness of the relief layer included in the prepared flexo printing plate is preferably equal to or greater than 50° and equal to or less than 90°. If the Shore A hardness of the relief layer is equal to or greater than 50°, printing can be normally performed without causing the minute halftone dots formed by engraving to be collapsed and crushed due to the strong printing pressure of the letterpress printing machine. Furthermore, if the Shore A hardness of the relief layer is equal to or less than 90°, it is possible to prevent the occurrence of printing blurring in a solid portion even when flexo printing is performed at a kiss-touch printing pressure.

Herein, the Shore A hardness in the present specification is a value measured by a durometer (spring-type rubber hardness tester) which pushes a stylus (referred to as an indenter point or an indenter) into the surface of the measurement target so as to cause deformation, measures the deformation amount (indentation depth), and digitizes the deformation amount.

[Flexo Printing Apparatus]

Next, the constitution of a flexo printing apparatus (hereinafter, simply referred to as a "printing apparatus" as well) using the flexo printing plate according to the present invention will be specifically described. Except for using the flexo printing plate described above, the flew printing apparatus basically has the same constitution as the flexo printing apparatus of the related art.

Figure 7:
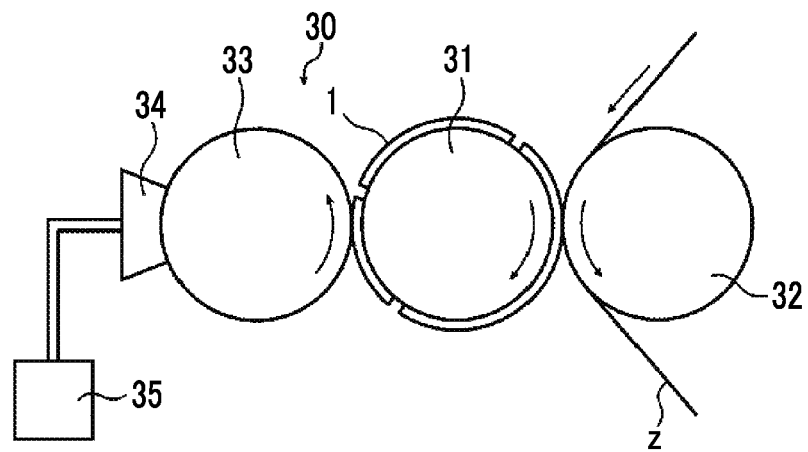
FIG. 7 is a view schematically showing main portions of a flexo printing apparatus using the flexo printing plate according to the present invention.

FIG. 7 is a view schematically showing main portions of the flexo printing apparatus using the flexo printing plate according to the present invention.

As shown in FIG. 7, a flexo printing apparatus 30 has a flexo printing plate 1 described above, a drum (plate cylinder) 31, a transport roller (impression cylinder) 32, an anilox roller 33, a doctor chamber 34, and a circulation chamber 35.

The drum 31 has a cylindrical shape, and the flexo printing plate 1 is loaded onto the peripheral surface thereof. While rotating, the drum 31 brings the flexo printing plate 1 into contact with a printing target z.

The transport roller 32 is a roller constituting a transport portion (not shown in the drawing) which transports the printing target z along a predetermined transport path. The transport roller 32 is disposed such that the peripheral surface thereof faces the peripheral surface of the drum 31, and brings the printing target z into contact with the flexo printing plate 1.

The drum 31 is disposed such that the rotation direction thereof becomes identical to the transport direction of the printing target z.

The anilox roller 33, the doctor chamber 34, and the circulation tank 35 are portions for supplying ink to the flexo printing plate 1. The circulation tank 35 stores ink, and the ink in the circulation tank 35 is supplied to the doctor chamber 34 by a pump (not shown in the drawing). The doctor chamber 34 is disposed to come into close contact with the surface of the anilox roller 33 and holds ink in the inside thereof. The anilox roller 33 rotates in synchronization with the drum 31 in a state of coming into contact with the peripheral surface of the drum 31, such that the printing plate 1 is coated (supplied) with the ink in the doctor chamber 34.

While transporting the printing target z along a predetermined transport path, the flexo printing apparatus 30 constituted as above rotates the flexo printing plate 1 loaded onto the drum 31 and transfers the ink to the printing target z, thereby performing printing. That is, the rotation direction of the drum onto which the flexo printing plate is loaded becomes the printing direction.

The type of the printing target used in the flexo printing apparatus using the flexo printing plate of the present invention is not particularly limited, and various known printing targets used in general flexo printing apparatuses, such as paper, films, and cardboards, can be used.

Furthermore, the type of the ink used in the flexo printing apparatus using the flexo printing plate of the present invention is not particularly limited, and various known inks used in general flexo printing apparatuses, such as an aqueous ink, a UV ink, an oil ink, and an EB ink, can be used.

EXAMPLES

Hereinafter, the present invention will be more specifically described based on examples, but the present invention is not limited thereto.

In the examples, unless otherwise specified, a number-average molecular weight (Mn) and a weight-average molecular weight (Mw) of a polymer represent values measured by a GPC method.

Example 1

<Preparation of Resin Composition for Laser Engraving>

By using a MS-type small pressurized kneader (manufactured by MORIYAMA), MITUI EPT 1045 (EPDM (Mooney viscosity ($ML_{1+4}$, 100° C.): 38, ethylene content: 58% by mass, diene content: 5% by mass, diene species: dicyclopentadiene (DCPD)), manufactured by Mitsui. Chemicals, Inc.) as a diene-based polymer, SEAST 9 (manufactured by Tokai Carbon Co., Ltd. (average particle size: 19 mm, specific surface area determined by nitrogen adsorption: 142 $m^2/g$)) as carbon black, and hydrophobic fumed silica AEROSIL R-972 (manufactured by NIPPON AEROSIL CO., LTD, specific surface area determined by nitrogen adsorption: 110±20 $m^2/g$) as a tiller were kneaded for 10 minutes at 80° C. with a front blade at 35 rpm and a rear blade at 35 rpm. Then, the kneaded material was cooled to 60° C., PERCUMYL D-40 (organic peroxide, dicumyl peroxide (40% by mass), manufactured by NOF CORPORATION) as a thermal polymerization initiator was added thereto, and kneaded for 10 minutes at 60° C. with a front blade at 20 rpm and a rear blade at 20 rpm, thereby preparing a resin composition for laser engraving.

<Preparation of Relief Layer>

The resin composition for laser engraving obtained as above was molded into a sheet-shaped material by using calender rolls (4 inverted L-shaped rolls manufactured Nippon Roll MFG Co., Ltd). By heating warm-up rolls to 50° C., the resin composition for laser engraving was preliminarily kneaded for 10 minutes. The kneaded material wound around the roll was cut in the process of kneading, drawn in the form of a sheet, and rolled up first. Thereafter, the kneaded material was set between the first calender roll and the second calender roll and molded by rolling. The temperature of each of the calender rolls was set such that the first roll had a temperature of 50° C., the second roll had a temperature of 60° C., the third roll had a temperature of 70° C., and the fourth roll had a temperature of 80° C. Regarding the roll gap, the gap between the first and second rolls was set to be 1.0 mm, the gap between the second and third rolls was set to be 0.9 mm, and the gap between the third and fourth rolls was set to be 0.8 mm. The transport rate was set to be 1 m/min.

After passing through the fourth roll, the kneaded material was cut in 20 cm (width)×20 cm (length) and then heated to 160° C. for 20 minutes under pressure of 4 MPa by using a press machine (SA-303 manufactured by TESTER SANGYO CO., LTD.), thereby obtaining a relief layer having an average film thickness of 0.8 mm.

<Preparation of Flexo Printing Plate Precursor>

The relief layer obtained as above was coated with a photocurable composition (manufactured by ThreeBond Holdings Co., Ltd.: 3030) such that a layer having an average film thickness of 80 μm was formed, then a PET support having a thickness of 250 μm was bonded thereto by using a nip roller. After 20 seconds, from the PET support side, the photocurable layer was cured by an UV exposure machine (UV exposure machine ECS-151U manufactured by EYE GRAPHICS Co., Ltd., metal halide lamp, 1,500 mJ/cm$^2$, exposure for 14 sec), thereby preparing a flexo printing plate precursor.

<Preparation of Flexo Printing Plate>

By using a laser engraving machine (1300S manufactured by Hell Gravure Systems), The flexo printing plate precursor obtained as above was engraved at a resolution of 2,540 dots per inch (dpi), a depth power of 100%, and a dot shape profile: slope of 60°, such that the following shape was obtained. Then, a washer (2% aqueous solution of JOY W Sterilization manufactured by Procter & Gamble Company) was applied onto the plate, the plate was rubbed with a pig hair brush, and rinsed with running water such that the engraving scum was removed.

The printing plate obtained after engraving had a shape in which a highlight halftone dot portion having a diameter of 30 mm was at the center of the printing plate, and a solid image portion separating 10 mm from the highlight halftone dot portion toward the upstream side in the printing direction extended in the width direction of the printing plate. That is, the length of the non-image portion adjacent to the highlight halftone dot portion was 10 mm.

Furthermore, the number of screen lines (definition) of the highlight halftone dot portion was set to be 175 lpi, the halftone dot area ratio was set to be 1%, the height of a small dot (first small dot 11) that was not lowered was set to be 125 μm, and the distal end diameter of small dots was set to be 15 μm.

In addition, a constitution was adopted in which the second small dot 12 adjacent to the non-image portion and the small dot in the second line (third small dot 13) was lowered.

The lowering amount was set to be 5 μm (4% of the height of the first small dot 11) for both the second small dot and the third small dot, and the distal end diameter of the small dots was set to be 15 μm.

Examples 2 to 12 and Comparative Examples 1 to 5

A flexo printing plate was prepared in the same manner as in Example 1, except that the halftone dot area ratio of the highlight halftone dot portion, the number of screen lines, the lowering amount, the number of small dots to be lowered, the distal end diameter of small dots, and the height of the small clot that was not lowered were changed as shown in Table 1.

Example 13

A flexo printing plate was prepared in the same manner as in Example 1, except that a constitution was adopted in which the small dots in the first to fifth lines from the non-image portion 2 side were lowered, and the lowering amount of the small dots was changed as shown in Table 2.

Example 14

A flexo printing plate was prepared in the same manner as in Example 13, except that the number of screen lines and the lowering amount of the small dots were changed as shown in Table 2.

[Evaluation]

By using the obtained flexo printing plate, priming was performed, and evaluation was performed regarding the printed material reproducibility of the small dot adjacent to the non-image portion and the tone jump of the halftone dot in the printed material.

(Printing Step)

As a printing machine, a 4C printing machine (manufactured by TAIYO KIKAI Ltd.) was used. The obtained printing plate was bonded to a printing plate cylinder (drum) through a cushion tape (manufactured by Lohmann. GmbH &; Co.KG) and installed in the printing machine. Thereafter, kiss touch (printing pressure at which the entirety of an image starts to be printed) was set to be 0 (standard printing pressure and under a condition in which a printing tar get was pressed by 40 μm at the set pressure, printing was performed at a printing rate of 150 m/min.

As the printing target, a 50 μm OPP film (manufactured by ABE Paper Corporation) was used. Furthermore, as the ink, an aqueous flexo ink, HYDRIC FCF (manufactured by Dainichiseika Color & Chemicals Mfg Co., Ltd.) was used.

(Printed Material Reproducibility of Small Dot)

The printed material reproducibility of the small dots in the vicinity of the non-image portion was observed using a 20× microscope (manufactured by KEYENCE CORPORATION, VHX-1000).

In a case where the size of dots printed on a printed material by the small dots in the vicinity of the non-image portion was equal to or greater than 100% and equal to or less than 110% of the size of dots printed by the small dots closest to the center of the highlight halftone dot portion, the printing plate was evaluated to be "A", In a case where the size was greater than 110% and equal to or less than 120% of the size of dots printed by the small dots closest to the center of the highlight halftone dot portion, the printing plate was evaluated to be "B". In a case where the size was greater than 120% of the size of dots printed by the small dots closest to the center of the highlight halftone dot portion, the printing plate was evaluated to be "C".

(Tone Jump)

Whether or not the tone jump of the halftone dot image occurred was evaluated by visual observation.

In a case where the halftone dot image was found to be smoothly reproduced on the printed material by visual observation, the printing plate was evaluated to be "A". In a case where slight density unevenness was visually observed, the printing plate was evaluated to be "B". In a case where density unevenness was clearly observed, the printing plate was evaluated to be "C".

The evaluation results are shown in Tables 1 and 2.

TABLE 1

| | | | Highlight halftone dot portion | | | | | | | | | |
|---|---|---|---|---|---|---|---|---|---|---|---|---|
| | | | Small dot adjacent to non-image portion | | | | | Small dots not being lowered | | | Evaluation | |
| | | | Number | | | | Reduction | | | | | |
| No. | Number of screen lines | Area ratio | of lines of small dots lowered | Lowering amount | Lowering rate | Distal end diameter | rate of distal end diameter | Height | Distal end diameter | Length of non-image portion | Reproducibility of printed material | Tone jump |
| Example 1 | 175 lpi | 1% | 2 | 5 μm | 4% | 15 μm | 0% | 125 μm | 15 μm | 10 mm | A | B |
| Example 2 | 175 lpi | 1% | 2 | 10 μm | 8% | 15 μm | 0% | 125 μm | 15 μm | 10 mm | A | A |
| Example 3 | 175 lpi | 1% | 2 | 40 μm | 33% | 15 μm | 0% | 125 μm | 15 μm | 10 mm | A | A |
| Example 4 | 175 lpi | 1% | 2 | 70 μm | 58% | 15 μm | 0% | 125 μm | 15 μm | 10 mm | A | A |
| Example 5 | 175 lpi | 10% | 2 | 15 μm | 13% | 50 μm | 0% | 125 μm | 50 μm | 10 mm | A | A |
| Example 6 | 175 lpi | 5% | 2 | 15 μm | 13% | 36 μm | 0% | 125 μm | 36 μm | 10 mm | A | A |
| Example 7 | 175 lpi | 1% | 1 | 5 μm | 4% | 15 μm | 0% | 125 μm | 15 μm | 10 mm | A | B |
| Example 8 | 175 lpi | 1% | 3 | 5 μm | 4% | 15 μm | 0% | 125 μm | 15 μm | 10 mm | A | A |
| Example 9 | 175 lpi | 1% | 5 | 5 μm | 4% | 15 μm | 0% | 125 μm | 15 μm | 10 mm | A | A |
| Example 10 | 175 lpi | 1% | 2 | 3 μm | 3% | 11 μm | 27% | 125 μm | 15 μm | 10 mm | A | A |
| Example 11 | 175 lpi | 1% | 5 | 3 μm | 3% | 7 μm | 53% | 125 μm | 15 μm | 10 mm | A | A |
| Example 12 | 150 lpi | 1% | 2 | 5 μm | 4% | 15 μm | 0% | 125 μm | 15 μm | 10 mm | A | A |
| Comparative Example 1 | 175 lpi | 1% | 0 | — | — | — | — | 125 μm | 15 μm | 10 mm | C | C |
| Comparative Example 2 | 175 lpi | 10% | 0 | — | — | — | — | 125 μm | 50 μm | 10 mm | C | C |
| Comparative Example 3 | 175 lpi | 5% | 0 | — | — | — | — | 125 μm | 36 μm | 10 mm | C | C |
| Comparative Example 4 | 175 lpi | 1% | 1 | 5 μm | 4% | 15 μm | 0% | 125 μm | 15 μm | 5 mm | C | C |
| Comparative Example 5 | 175 lpi | 1% | 3 | 5 μm | 4% | 15 μm | 0% | 125 μm | 15 μm | 5 mm | C | C |

TABLE 2

| | | | Highlight halftone dot portion | | | | | | | | |
|---|---|---|---|---|---|---|---|---|---|---|---|
| | Number of | | Small dots adjacent to non-image portion | | | | | | | | |
| | | | First line | | Second line | | Third line | | Fourth line | | Fifth line |
| No. | screen lines | Area ratio | Lowering amount | Lowering rate | Lowering amount | Lowering rate | Lowering amount | Lowering rate | | | |
| Example 13 | 175 lpi | 1% | 70 μm | 58% | 40 μm | 33% | 20 μm | 17% | | | |
| Example 14 | 150 lpi | 1% | 60 μm | 50% | 30 μm | 25% | 15 μm | 13% | | | |

| | Highlight halftone dot portion Small dots adjacent to non-image portion | | | | Length of non-image portion | Evaluation | |
|---|---|---|---|---|---|---|---|
| | Fourth line | | Fifth line | | | Reproducibility of printed material | Tone jump |
| No. | Lowering amount | Lowering rate | Lowering amount | Lowering rate | | | |
| Example 13 | 10 μm | 8% | 5 μm | 4% | 10 mm | A | A |
| Example 14 | 7 μm | 6% | 5 μm | 4% | 10 mm | A | A |

From the results shown in Tables 1 to 2, it is understood that in Examples 1 to 13 of the present invention having a constitution in which, within the highlight halftone dot portion having a halftone dot area ratio of higher than 0% and equal to or lower than 10%, among the small dots constituting the highlight halftone dot portion, the small dots adjacent to the non-image portion that continues 10 mm or further in a direction separating from the edge of the highlight halftone dot portion have a height smaller than the height of small dots closest to the center of the highlight halftone dot portion, the printed material reproducibility is better than in Comparative Examples 1 to 5 because the enlargement of halftone dots can be inhibited. Furthermore, it is understood that Examples 1 to 13 of the present invention are excellent because tone jump, that is, the discontinuity of density is not visually recognized.

From Comparative Examples 4 and 5, it is understood that, in a case where the length of the non-image portion adjacent to the small dots is less than 10 mm, that is, in a case where the distance between the non-image portion and the image portion adjacent to each other is short, when the small dots on the non-image portion side of the highlight halftone dot portion are lowered, voids occurs.

From the comparison between Example 1 and Examples 2 to 4, it is understood that the lowering amount is preferably equal to or greater than 5% of the height of the small dots closest to the center (small dots not being lowered).

From the comparison of Examples 7 to 9, it, is understood that it is preferable to lower the small dots in the second line and the following lines from the non-image portion side.

From the comparison of Examples 10 and 11 and Example 1 and the like, it is understood that the distal end diameter of the small dots to be lowered is preferably made smaller than the distal end diameter of the small dots closest to the center.

By the above results, the effects of the present invention are clarified.

EXPLANATION OF REFERENCES 1, 100: flew printing plate
2, 102: non-image portion
3, 103: image portion
4: highlight halftone dot portion
5: image portion other than highlight halftone dot portion
11, 111: first small dot
12, 112: second small dot
13, 113: third small dot
30: flexo printing apparatus
31: drum
32: transport roller
33: anilox roller
34: doctor chamber
35: circulation tank
50, 150: printing substrate
51, 151: first dot
52, 152: second dot
53, 153: third dot
60: calender roll
62a to 62d: first to fourth rolls
70: kneaded material
71: resin sheet
z: printing target

What is claimed is:

1. A flexo printing plate comprising:
an image portion including a halftone dot portion; and
a non-image portion,
wherein the halftone dot portion includes a highlight halftone dot portion having a halftone dot area ratio of higher than 0% and equal to or lower than 10%,
the non-image portion has a non-image portion that continues 10 mm or further in a direction separating from the edge of the highlight halftone dot portion,
within the highlight halftone dot portion among small dots constituting the highlight halftone dot portion, at least one small dot adjacent to the non-image portion that continues 10 mm or further in a direction separating from the edge of the highlight halftone dot portion has a height smaller than an average height of the small dots of the highlight halftone dot portion,
in the highlight halftone dot portion, a difference between a height of a small dot adjacent to the non-image portion and the average height of the small dots of the highlight halftone dot portion is 5% to 70% of the average height of the small dots of the highlight halftone dot portion, and
within the highlight halftone dot portion, the small dots adjacent to the non-image portion that continues less than 10 mm in the direction separating from the edge of the highlight halftone dot portion have a height equal to or more than the average height of the small dots of the highlight halftone dot portion.

2. The flexo printing plate according to claim 1, wherein within the highlight halftone dot portion, the height of the small dots decreases as the small dots become close to the non-image portion.

3. The flexo printing plate according to claim 2, wherein the height of all small dots adjacent to the non-image portion is smaller than a height of a small dot closest to the center of the highlight halftone dot portion.

4. The flexo printing plate according to claim 3, wherein a distal end diameter of the small dot adjacent to the non-image portion is smaller than a distal end diameter of the small dot closest to the center of the highlight halftone dot portion.

5. The flexo printing plate according to claim 4, wherein the image portion including the highlight halftone dot portion and the non-image portion are formed by laser engraving.

6. The flexo printing plate according to claim 1, wherein the height of all small dots adjacent to the non-image portion is smaller than a height of a small dot closest to the center of the highlight halftone dot portion.

7. The flexo printing plate according to claim 1, wherein a distal end diameter of the small dot adjacent to the non-image portion is smaller than a distal end diameter of the small dot closest to the center of the highlight halftone dot portion.

8. The flexo printing plate according to claim 1, wherein the image portion including the highlight halftone dot portion and the non-image portion are formed by laser engraving.

9. The flexo printing plate according to claim 1, wherein within the highlight halftone dot portion, the small dots within a range of 500 μm from a boundary between the highlight halftone dot portion and the non-image portion have a height smaller than the average height of the small dots of the highlight halftone dot portion.

* * * * *